(12) United States Patent
Jen et al.

(10) Patent No.: US 11,316,055 B2
(45) Date of Patent: Apr. 26, 2022

(54) COMPOUND FOR USE IN AN OPTOELECTRONIC DEVICE INCLUDING A HETEROJUNCTION

(71) Applicant: City University of Hong Kong, Kowloon (HK)

(72) Inventors: Alex K. Y. Jen, Kowloon (HK); Zonglong Zhu, Kowloon (HK); Zhengtao Xu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/669,697

(22) Filed: Oct. 31, 2019

(65) Prior Publication Data

US 2021/0135026 A1  May 6, 2021

(51) Int. Cl.
*H01L 31/0224* (2006.01)
*H01L 51/50* (2006.01)
*H01L 51/00* (2006.01)

(52) U.S. Cl.
CPC .. *H01L 31/022425* (2013.01); *H01L 51/0056* (2013.01); *H01L 51/0072* (2013.01); *H01L 51/0084* (2013.01); *H01L 51/5056* (2013.01); *H01L 51/5072* (2013.01)

(58) Field of Classification Search
CPC ............ H01L 51/0056; H01L 51/0072; H01L 51/0084; H01L 51/5072; H01L 51/5056; H01L 31/022425
See application file for complete search history.

(56) References Cited

U.S. PATENT DOCUMENTS

| 2008/0223444 | A1* | 9/2008 | Marder | C09K 11/06 136/263 |
|---|---|---|---|---|
| 2018/0033985 | A1* | 2/2018 | Huang | C07D 401/04 |
| 2020/0106019 | A1* | 4/2020 | Palmstrom | H01L 51/422 |
| 2020/0140439 | A1* | 5/2020 | Rybtchinski | C07D 471/22 |

OTHER PUBLICATIONS

Zhang et al., "New generation perovskite solar cells with solution processed amino substituted perylene diimide derivate as electron transport layer", Journal of Materials Chemistry A, 2016 (Year: 2016).*

* cited by examiner

*Primary Examiner* — Golam Mowla
(74) *Attorney, Agent, or Firm* — Renner Kenner Greive Bobak Taylor & Weber

(57) ABSTRACT

The present invention relates to a compound for use in an optoelectronic device including a heterojunction. The heterojunction includes a metal-organic framework optimized for operation as an electron transport layer in an optoelectronic device.

12 Claims, 11 Drawing Sheets

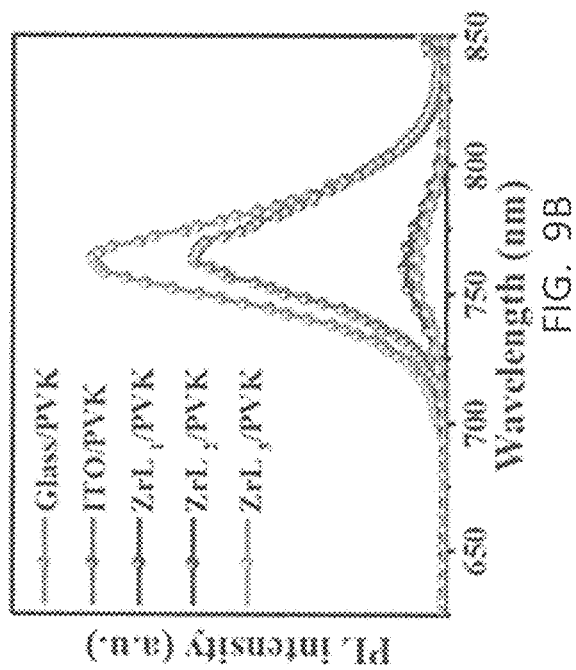
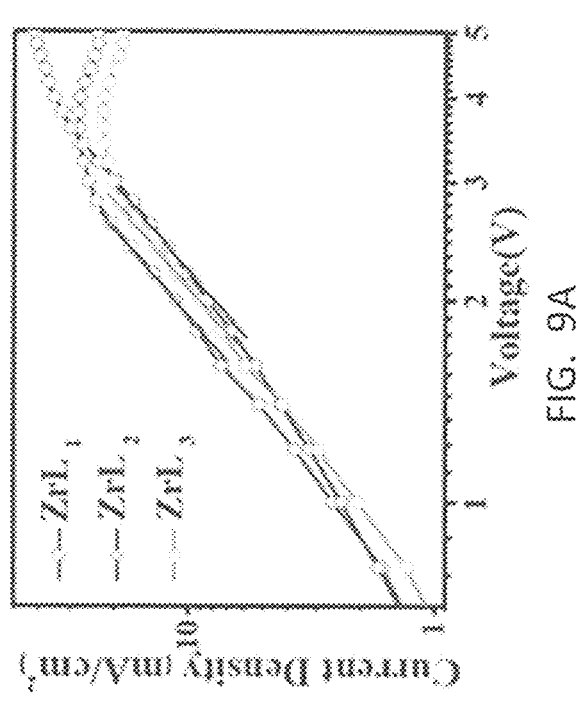
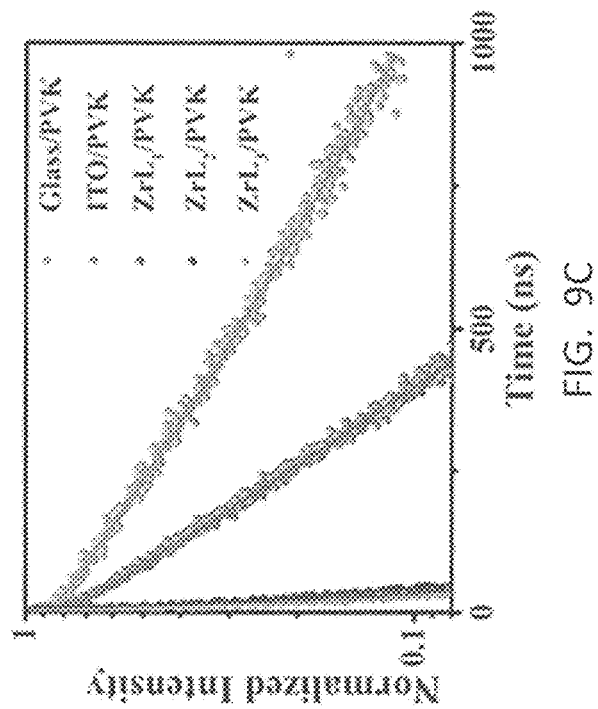
FIG. 9A
FIG. 9B
FIG. 9C

COMPOUND FOR USE IN AN OPTOELECTRONIC DEVICE INCLUDING A HETEROJUNCTION

TECHNICAL FIELD

The present invention relates to a compound for use in an optoelectronic device including a heterojunction, and particularly, although not exclusively, to a solar cell structure including metal-organic framework.

BACKGROUND

Electronic devices are components in various electrical appliances and equipment. Examples of these devices include light emitting diodes (LEDs), solar cells, photonic devices, transistors or computer processors which may be included to provide different functions in an electrical apparatus.

In some example device structures, there exists energy level mismatch between adjacent layers of material, such as at the interface between an electrode and an active material in one or more of the abovementioned electronic devices. To improve the conductivity between these layers, additional electrically conductive layer may be applied to improve the electrical contact formed therebetween.

SUMMARY OF THE INVENTION

In accordance with a first aspect of the present invention, there is provided a compound having a structure of Formula (I) or its derivative,

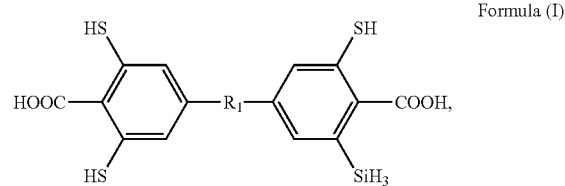

Formula (I)

wherein $R_1$ is selected form the group consisting of the following moieties:

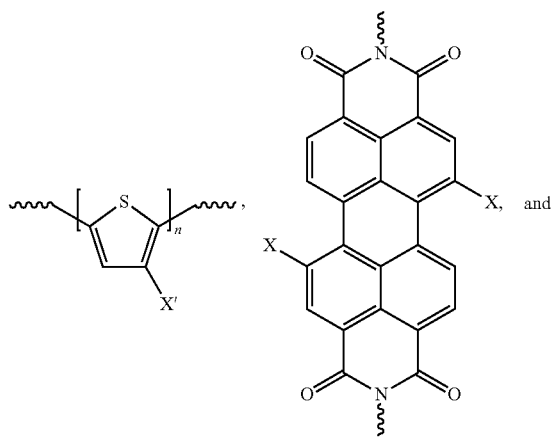

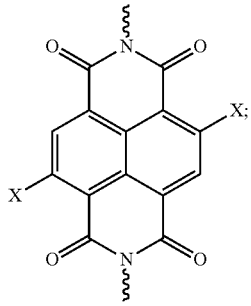

where X is a hydrogen atom or a halogen atom, X' is a straight or branched alkyl group, n is an integer selected from 1 to 5, and the wavy line denotes a linkage between $R_1$ and an adjacent atom.

In an embodiment of the first aspect, X is F, Cl or Br.

In an embodiment of the first aspect, wherein X' is an octyl group, and n represents the number of thiophene unit, which may be 1 or 2.

In an embodiment of the first aspect, the compound has a structure of Formula. Preferably, Naphthalenediimide and its derivative may be the preferred unit to synthesize the compound.

In accordance with a second aspect of the present invention, there is provided a compound having a structure of Formula (II) or its derivative,

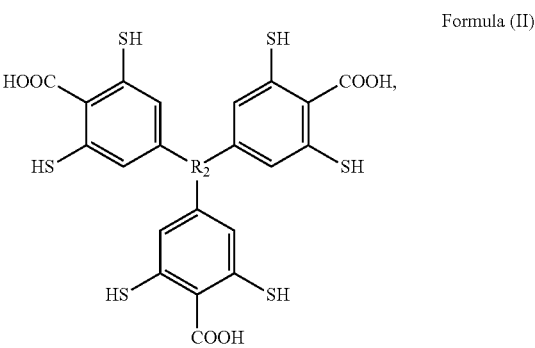

Formula (II)

wherein $R_2$ is selected from the group consisting of the following moieties:

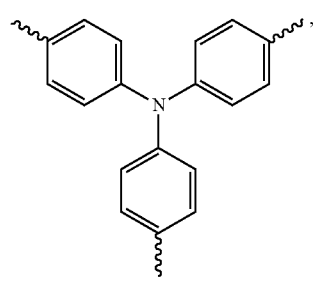

-continued

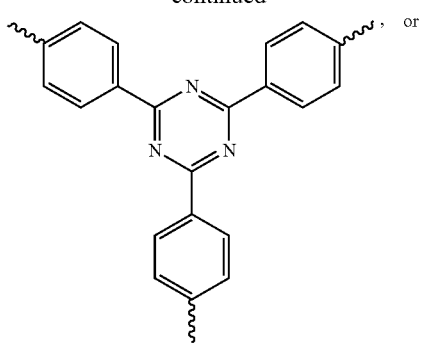

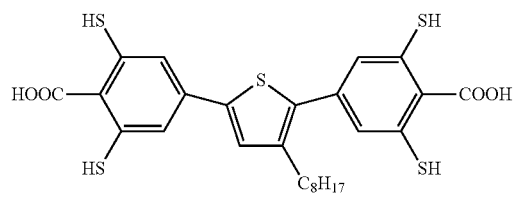

where $R_3$, $R_4$, $R_5$, $R_6$, $R_7$ and $R_8$ are independently selected from the group consisting of a hydrogen atom, a straight or branched alkyl group, an aryl group, an alkenyl group, and an alkynl group, and wherein the wavy line denotes a linkage between $R_2$ and an adjacent atom.

Preferably, $C_{3h}$ Truxene and its derivative is the preferred unit to synthesize the compound.

Preferably, the MOF may include a structure of the followings:

Formula (Ia)

In an embodiment of the second aspect, $R_3$, $R_4$, $R_5$, $R_6$, $R_7$ and $R_8$ are independently a straight or branched C3-C9 alkyl group.

In an embodiment of the second aspect, the $R_3$, $R_4$, $R_5$, $R_6$, $R_7$ and $R_8$ are the same.

In an embodiment of the second aspect, the compound has a structure of Formula (IIa):

Formula (IIa)

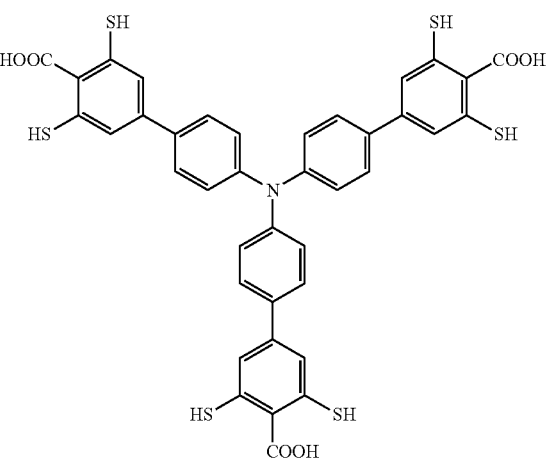

or its derivatives.

In an embodiment of the second aspect, the compound has a structure of Formula (IIb):

Formula (Ib)

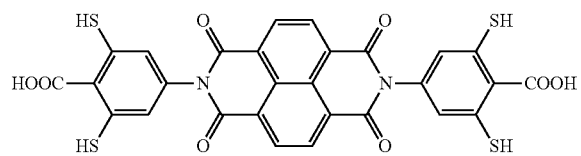

Formula (Ic)

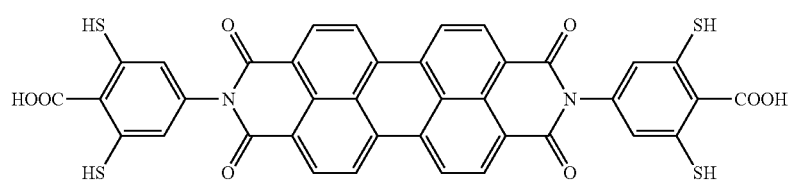

or its derivatives.

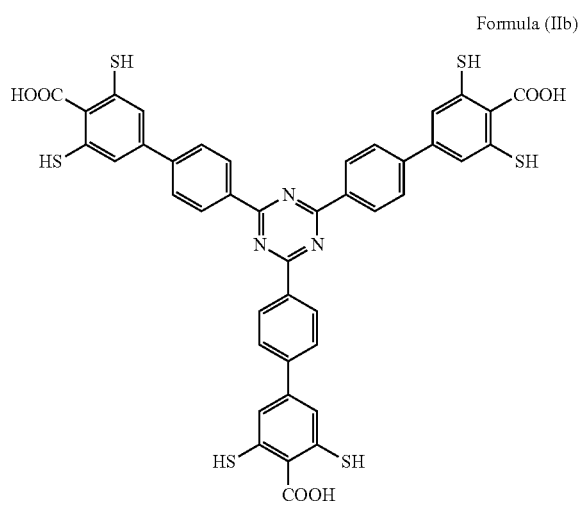 [SMILES: O=C(O)c1c(S)cc(-c2ccc(-c3nc(-c4ccc(-c5cc(S)c(C(=O)O)c(S)c5)cc4)nc(-c4ccc(-c5cc(S)c(C(=O)O)c(S)c5)cc4)n3)cc2)cc1S]

Formula (IIb)

or its derivatives.

In an embodiment of the second aspect, the compound has a structure of Formula (IIc):

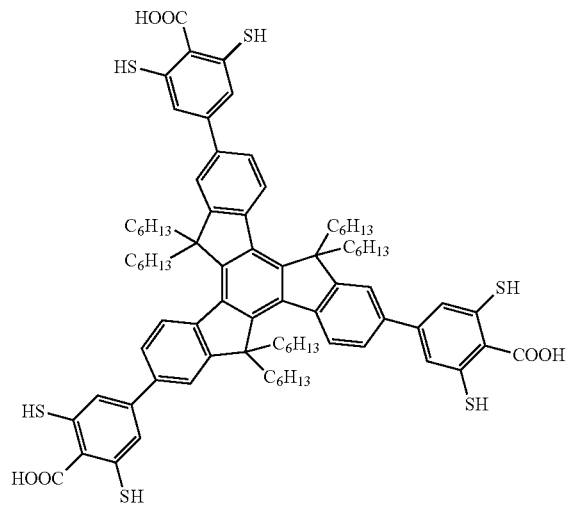

Formula (IIc)

or its derivatives.

In accordance with a third aspect of the present invention, there is provided a compound having a structure of Formula (III) or its derivative,

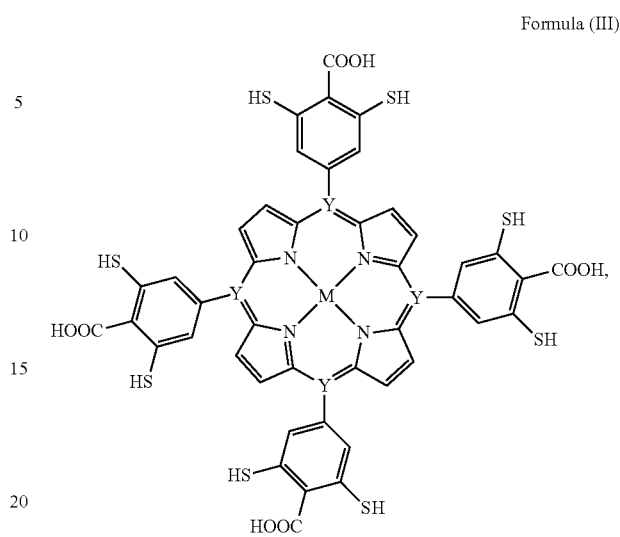

Formula (III)

where M is a metal atom, and Y is a carbon atom or a nitrogen atom.

In an embodiment of the third aspect, Y is a carbon atom.

In an embodiment of the third aspect, the compound has a structure of Formula (IIIa),

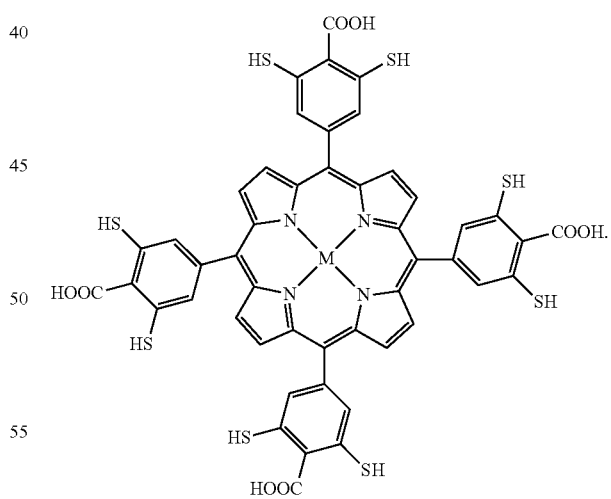

Formula (IIIa)

In accordance with a fourth aspect of the present invention, there is provided a compound having a structure of Formula (IV) or its derivative,

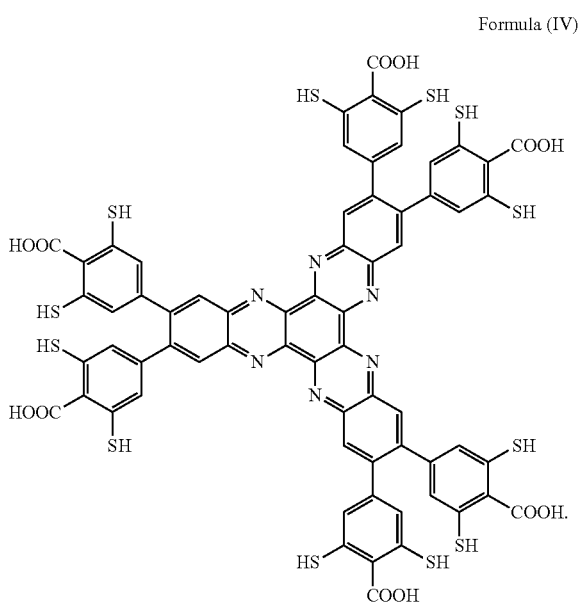 [SMILES: O=C(O)c1c(S)cc(-c2cc3nc4c5nc6cc(-c7cc(S)c(C(=O)O)c(S)c7)c(-c7cc(S)c(C(=O)O)c(S)c7)cc6nc5c5nc6cc(-c7cc(S)c(C(=O)O)c(S)c7)c(-c7cc(S)c(C(=O)O)c(S)c7)cc6nc5c4nc3cc2-c2cc(S)c(C(=O)O)c(S)c2)cc1S]

Formula (IV)

In accordance with a fifth aspect of the present invention, there is provided a heterojunction comprising: a photoactive layer comprising a photoactive perovskite; and an electron transport layer including a compound according to the first, second, third or fourth aspect.

In an embodiment of the fifth aspect, the electron transport layer includes a metal-organic framework.

In an embodiment of the fifth aspect, the metal-organic framework includes a Zr metal-organic framework.

In an embodiment of the fifth aspect, the photoactive perovskite includes an ammonium trihalogen plumbate.

In an embodiment of the fifth aspect, the ammonium trihalogen plumbate is selected from the group consisting of methyl, formamidinium, and cesium ammonium plumbate.

In accordance with a sixth aspect of the present invention, there is provided an optoelectronic device comprising a pair of electrodes disposed on opposite sides of the heterojunction in accordance with the fifth aspect.

In an embodiment of the sixth aspect, the device further comprises a charge transport layer adjacent to the photoactive perovskite layer.

In an embodiment of the sixth aspect, the charge transport layer includes a hole transport material.

In an embodiment of the sixth aspect, the hole transport material includes Spiro-MeOTAD and/or $MoO_3$.

In an embodiment of the sixth aspect, the electron transport layer includes a metal-organic framework.

In an embodiment of the sixth aspect, the metal-organic framework includes a Zr metal-organic framework.

In an embodiment of the sixth aspect, the photoactive perovskite includes an ammonium trihalogen plumbate.

In an embodiment of the sixth aspect, the ammonium trihalogen plumbate is selected from the group consisting of methyl, formamidinium, and cesium ammonium plumbate.

In an embodiment of the sixth aspect, the optoelectronic device is a photovoltaic cell.

BRIEF DESCRIPTION OF THE DRAWINGS

Embodiments of the present invention will now be described, by way of example, with reference to the accompanying drawings in which:

FIGS. 9A, 9B, and 9C are plots showing (a) The electron injection characteristics measured by SCLC method based on the device structure of ITO/ZnO/MOF/Ag; (b) steady PL spectra and (c) time-resolved PL decay of the as-achieved perovskite thin films with or without prepared ETM;

DETAILED DESCRIPTION

The inventors have, through their own research, trials and experiments, devised that metal-organic frameworks (MOF) and perovskite solar cells (PVSC), may be used for boosting photovoltaic performances, and for advancing renewable energy and sustainable development technologies. The improvements may be rooted in the broad and tunable functions of MOF solids as a versatile class of well-defined hybrid materials.

Preferably, MOF materials may be specifically tailored to synergize with the PVSC design. For example, MOFs may be deposited as a surface modifier of the electron transport layer (ETL) to promote perovskite crystallinity and device stability. The use of MOF components as charge transport layers, however, appears to be more challenging, as MOF solids are generally insulators with inadequate carrier mobilities. Preferably, co-depositing with more conductive supplements may be necessary in some examples.

In some examples, MOF systems may be unfunctionalized and may lack chemical modifications for optimizing integration with the PVSC device.

Figure 1:
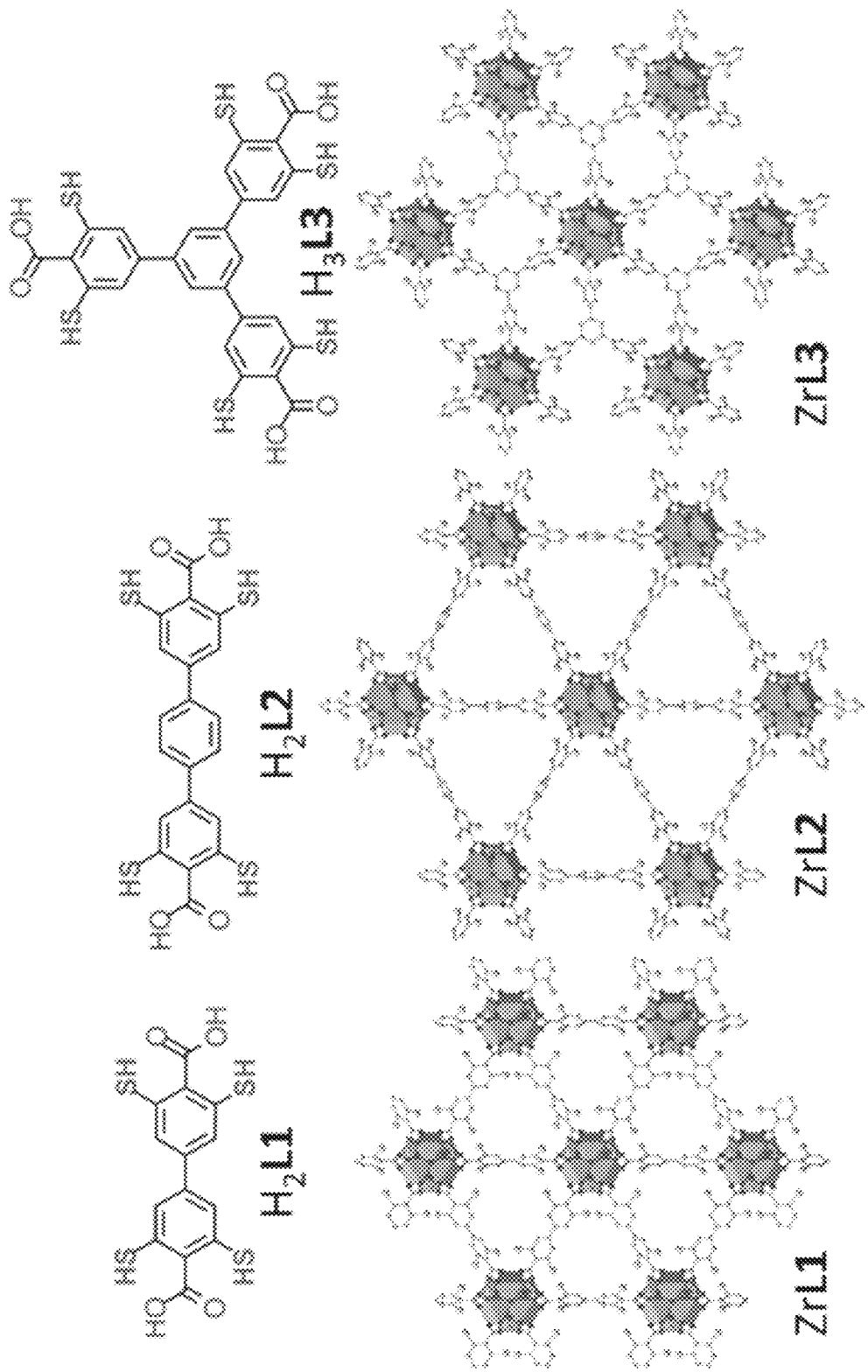
FIG. 1 is an illustration showing compounds for forming MOF materials in accordance with embodiments of the present invention, including example thiol-decked carboxyl linkers $H_2L1$, $H_2L2$ and $H_3L3$ and the structure models of the corresponding 2D MOFs of ZrL1, ZrL2 and ZrL3.

With reference to FIG. 1, there is shown a number of example MOF materials for use in an optoelectronic device. Preferably, the dense array of thiol functions of the MOF materials synthesized has a versatile reactivity, in which the thiol groups may operate as key functionalizing unit at the forefront of MOF chemistry, imparting metal uptake and removal, catalysis and electronic/conductive properties.

In addition, the use of Zr(IV) ions to selectively engage the hard carboxyl groups may also allow dense free-standing thiol arrays to be built around the Zr(IV)-oxo cluster to offer steric shielding and stabilization. More details of the advantages of these examples will be discussed later in the disclosure.

According to a preferred embodiment of the present invention, there is provided an optoelectronic device comprising a heterojunction formed by a layer of MOF material and a photoactive perovskite layer. The heterojunction may be further combined with other layers of material such as a hole transport layer and the electrodes layer to form a complete optoelectronic device. For example, the optoelectronic device may operate to absorb photons or light to generate electrical signals or power to an external circuit. In this example, the device operates as a photovoltaic cell which is most suitable for absorbing sunlight and generating electrical power.

The term "photoactive" in relation to the perovskite encompasses both light-absorbing and light-emitting perovskites. The layer comprising such photoactive perovksite may therefore also either be light-absorbing or light-emitting.

The term "light-absorbing" in relation to the perovskite (and by extension the layer comprising said perovskite) refers to its role in absorbing light, e.g. visible light, so as to act as a light absorbing material which converts the light into electrical energy when used in photovoltaic cells, photo-detectors and other such optoelectronic devices whose function is reliant upon the absorption of light, and therefore the perovskite is selected whereby to be capable performing this function.

The term "light-emitting" in relation to the perovskite (and by extension the layer comprising said perovskite) refers to its function as an active light-emitting (e.g. visible-light-emitting) region and thus the term "light-emitting perovskite" may equivalently be employed in order to reflect this purpose.

The terms "photoactive perovskite" and "photoactive layer" will generally be employed throughout this description for consistency and simplicity but it should be understood that this encompasses both light-emitting and light-absorbing perovskites and perovskite-containing layers unless one or the other of these is specifically mentioned, for example depending on the particular nature of any given optoelectronic device incorporating a heterojunction as described herein.

While photovoltaic cells are frequently used herein as illustration, it will be appreciated that the heterojunctions in accordance with embodiments of the invention may equally be applied to other corresponding optoelectronic devices including all those described in all sections herein. In particular, the following discussion is generally applicable amongst other devices to photovoltaic cells (solar cells), photo-detectors, light-emitting diodes, and electrical injection lasers comprising a heterojunction according to the invention.

Preferably, the heterojunctions described herein comprise a photoactive perovskite. For example, perovskites may be materials which adopt a similar crystal structure to calcium titanate and have the general formula $ABX_3$, wherein A and B are cations of differing size, A being larger than B, and X is an anion. In the ideal cubic-symmetry structure, adopted by $CaTiO_3$, the B cation ($Ti^{4+}$) is 6-fold coordinated, surrounded by an octahedron of anions, and the A cation ($Ca^{2+}$) is in 12-fold cuboctahedral coordination. The relative ion size requirements for stability of the cubic structure are quite stringent, so slight buckling and distortion can produce several lower-symmetry distorted versions, in which the coordination numbers of A cations, B cations or both are reduced, producing orthorhombic, tetragonal or trigonal symmetry. For the avoidance of doubt, references to perovskites herein generically refer both to ideal cubic structures as well as lower symmetry, distorted structures.

These example embodiments of perovskites may be suitable for use in heterojunctions and optoelectronic devices according to the invention include ammonium trihalogen plumbates such as $CH_3NH_3PbI_3$, $CH_3NH_3PbCl_3$, $CH_3NH_3PbF_3$ and $CH_3NH_3PbBr_3$; mixed-halide ammonium trihalogen plumbate perovskites with general formula $CH_3NH_3Pb[Hal1]_{3-x}[Hal2]_x$ wherein [Hal1] and [Hal2] are independently selected from among F, Cl, Br and I, so that [Hal1] and [Hal2] are non-identical and wherein $0<x\leq3$, preferably wherein x is an integer (e.g. 1, 2 or 3, preferably 1 or 2); $CsSnX_3$ perovskites wherein X is selected from among F, Cl, Br and I, preferably I; organometal trihalide perovskites with the general formula $(RNH_3) BX_3$ where R is $CH_3$, $C_nH_{2n}$ or $C_nH_{2n+n}$, n is an integer in the range $2\leq n\leq10$, preferably $2\leq n\leq5$, e.g. n=2, n=3, or n=4, most preferably n=2 or n=3, X is a halogen (F, I, Br or Cl), preferably I, Br or Cl, and B is Pb or Sn; and combinations thereof.

Such perovskites as described herein may be equally suitable for use either as light-emitting or light-absorbing perovskites in the heterojunctions of the invention. The perovskites employed in the heterojunctions of the invention are preferably undoped but may if desired be doped with p-type or n-type dopants. Thus the perovskites referred to herein may be essentially pure semiconductor (e.g. having only unavoidable impurities). Alternatively they may be doped (throughout and/or at the surface) with at least one dopant material of greater valency than the bulk (to provide n-type doping) and/or may be doped with at least one dopant material of lower valency than the bulk (to give p-type doping). n-type doping will tend to increase the n-type character of the semiconductor material while p-type doping will tend to reduce the degree of the natural n-type state (e.g. due to defects).

Such doping may be made with any suitable element including F, Sb, N, Ge, Si, C, In, InO and/or Al. Suitable dopants and doping levels will be evident to those of skill in the art.

In certain embodiments, the heterojunctions of the present application are planar heterojunctions between the photoactive perovskite layer and the electron transport materials.

Preferably, the electron transport material layer includes a compound forming the MOF material and hence the photoactive perovskite layer by combing the MOF layer and the perovskite layer to define the photovoltaic device.

With reference back to FIG. 1, there are shown examples of MOF derived ETM of ZrL1, ZrL2 and ZrL3 solvothermally prepared in DMF (N, N-dimethylformamide), using ZrOCl$_2$·8H$_2$O as the metal source, formic acid as the modulator, and ethylene dithiol for stabilizing the thiol groups on the organic linker. The three linker molecules H$_2$L1, H$_2$L2 and H$_3$L3 may be synthesized using the a benzyl mercaptan/AlCl$_3$ protocol to exploit the versatile sulfur chemistry in the open framework medium.

The inventors devise that the PXRD patterns of as-made ZrL1, ZrL2 and ZrL3 can be indexed onto hexagonal unit cells (parameters: ZrL1, a=19.10, c=7.32 Å; ZrL2, a=23.19, c=7.21 Å; ZrL3, a=19.88, c=7.29 Å). The short c axes point to a single-layer structure based on Zr$_6$O$_8$ clusters as it compares well with the corresponding inter-layer distance in a known structure.

The individual layers can be modeled on the familiar hxl net for ZrL1 and ZrL2 and kgd net for ZrL3, respectively, in which the Zr$_6$O$_8$ cluster serves formally as a planar 6-connected node. The close match of the intensity profiles of the PXRD patterns indicate that the layers are stacked in an eclipsed fashion to form distinct open channels along the c axis. The facile formation of these 2D sheets appears to be induced by the mercapto groups that flank the carboxyl endpoints, as similar linear linkers without these flanking thiol motifs were found to adopt 3D frameworks with the Zr$_6$ oxo cluster acting as higher-connected nodes.

Amidst the many Zr-MOF structures, two-dimensional (2D) cases remain rare (e.g., tritopic linker, TBT-based, ditopic linker based), partly because the high connectivity of the Zr$_6$O$_8$ node (offering up to 12 connections) often leads to three-dimensional networks. To target 2D frameworks, capping agents and solvent conditions may need to be carefully screened to avoid the 3D alternatives. By comparison, the series of 2D networks here form conveniently in high yields. They are also stable in air and water, together with their versatile mercapto functions, offer clear promises as 2D materials.

Alternatively, the linker molecules may be of other form or structures, and form the MOF according to different preferable embodiments of the present invention.

In a first preferred embodiment, the MOF includes a compound having a structure of Formula (I) or its derivative,

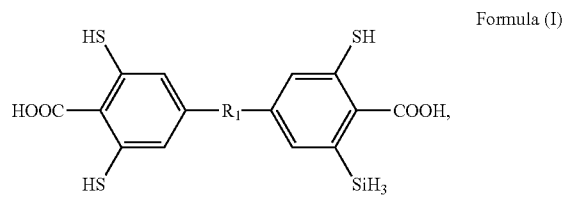

Formula (I)

wherein R$_1$ is selected form the group consisting of the following moieties:

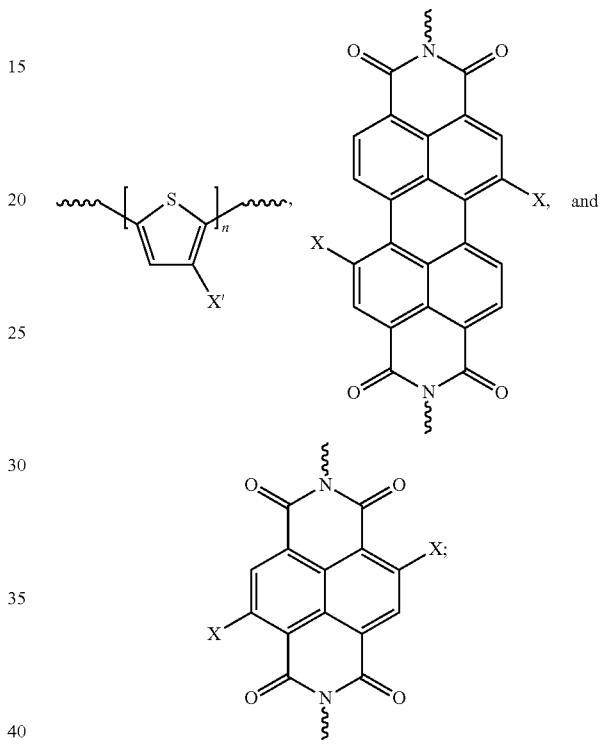

where X is a hydrogen atom or a halogen atom, X' is a straight or branched alkyl group, n is an integer selected from 1 to 5, and the wavy line denotes a linkage between R$_1$ and an adjacent atom.

Preferably, the MOF may include a structure of the followings:

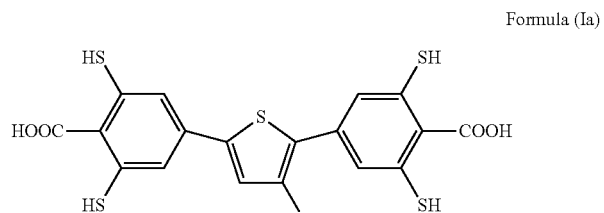

Formula (Ia)

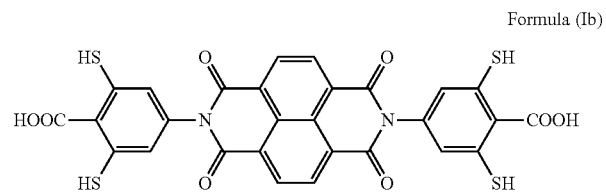

Formula (Ib)

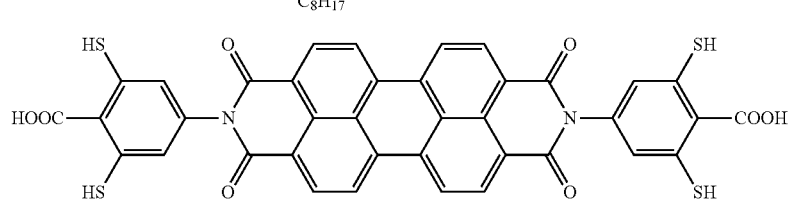

Formula (Ic)

or its derivatives.

In this embodiment, $R_1$ is selected form poly(3-hexylthiophene) (P3HT), Naphthalenediimide (NDI) and 3,4,9,10-Perylenetetracarboxylicdiimide (PDI), X is a hydrogen atom or a halogen atom such as F, Cl or Br. More preferably, in the example with $R_1$ being P3HT, X' is an octyl group, and n represents the number of thiophene unit, wherein n equals to 1 or 2 in Formula (Ia).

Some defects from under-coordinated Pb atoms on the surface of perovskite films can result in non-radiative recombination to affect device performance. Thiophene and carbonyl group are Lewis base, which can passivate the defection and reduce the non-radiative recombination.

In a second preferred embodiment, the MOF includes a compound having a structure of Formula (II) or its derivative, Formula (II)

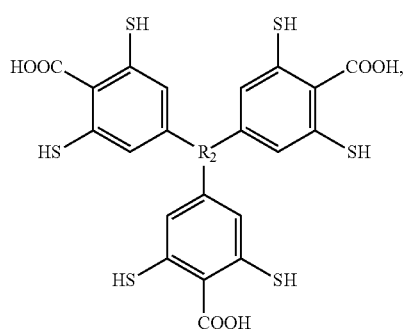

wherein $R_2$ is selected from the group consisting of the following moieties:

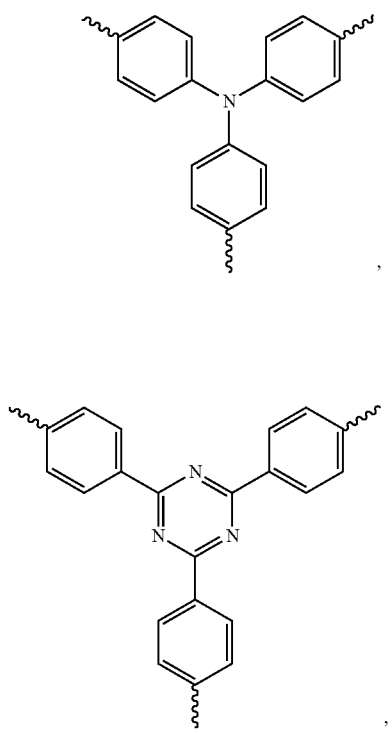

, or

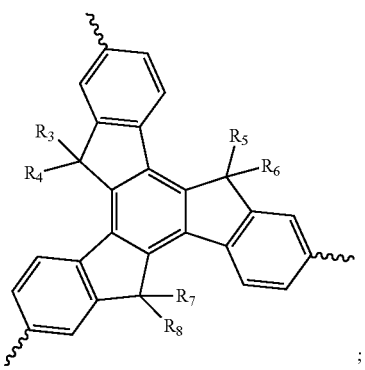

;

where $R_3$, $R_4$, $R_5$, $R_6$, $R_7$ and $R_8$ are independently selected from the group consisting of a hydrogen atom, a straight or branched alkyl group, an aryl group, an alkenyl group, and an alkynl group, and wherein the wavy line denotes a linkage between $R_2$ and an adjacent atom.

In this embodiment, $R_2$ is independently selected from the group consisting of triphenylamine, 2,4,6-triphenyl-1,3,5-triazine and $C_{3h}$ Truxene. Besides, each $R_3$, $R_4$, $R_5$, $R_6$, $R_7$ and $R_8$ is independently selected from the group consisting of straight-chain and branched alkyl, aryl, alkenyl, and alkynl groups.

Optionally, $R_3$, $R_4$, $R_5$, $R_6$, $R_7$ and $R_8$ are independently a straight or branched C3-C9 alkyl group. In addition, $R_3$, $R_4$, $R_5$, $R_6$, $R_7$ and $R_8$ may be the same.

Preferably, the compound may have a structure of Formula (IIc):

Formula (IIc)

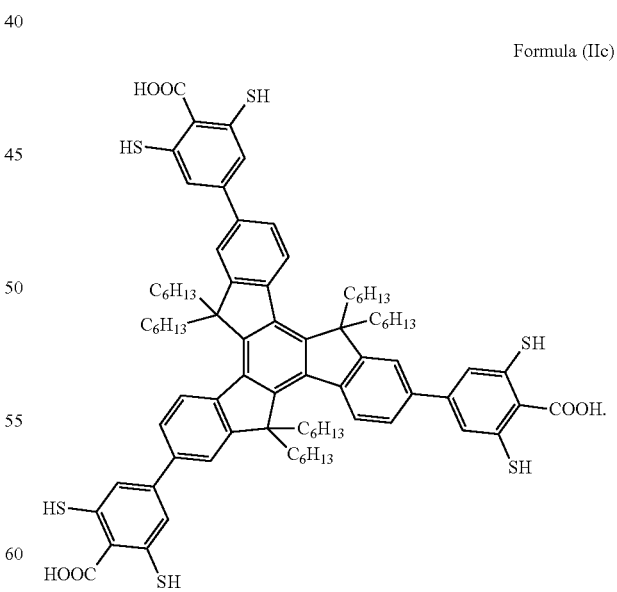

The compound has a $C_{3h}$ symmetrical Truxene-core with six hexyl side-chains, consisting of a planar, rigid and conjugated molecular geometry. This will be beneficial to have high charge mobility and suitable energy level.

Alternatively, the MOF has a structure of any of the followings:

Formula (IIa)

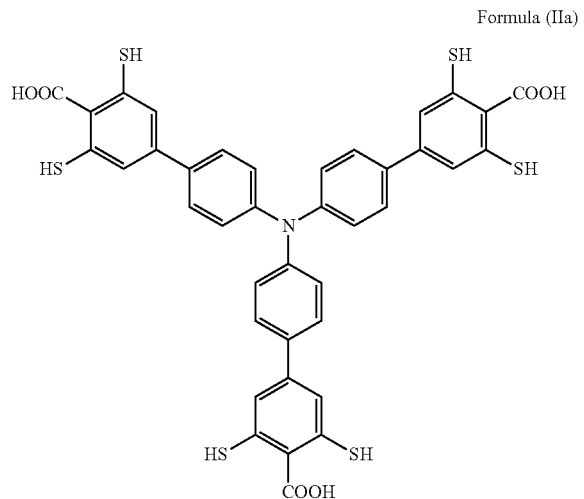

Formula (IIb)

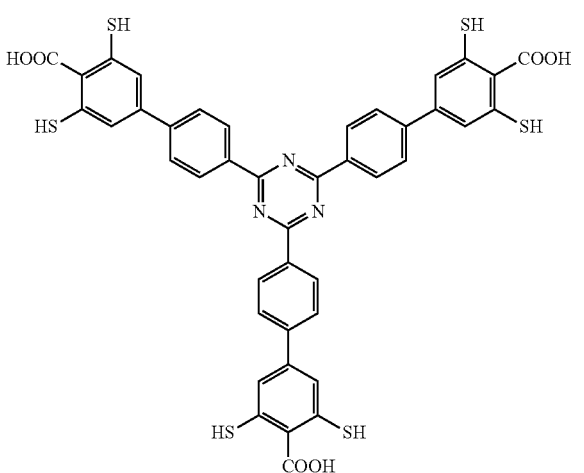

or its derivatives.

In a third preferred embodiment, the MOF includes a compound having a structure of Formula (III) or its derivative, Formula (III)

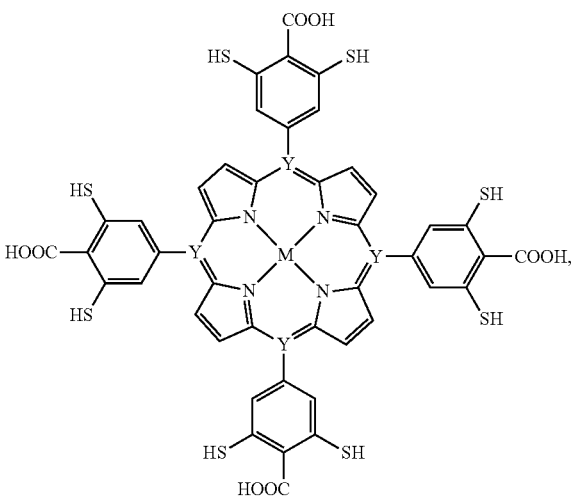

where M is a metal atom, and Y is a carbon atom or a nitrogen atom.

When Y is a carbon atom, the compound has a structure of:

Formula (IIIa)

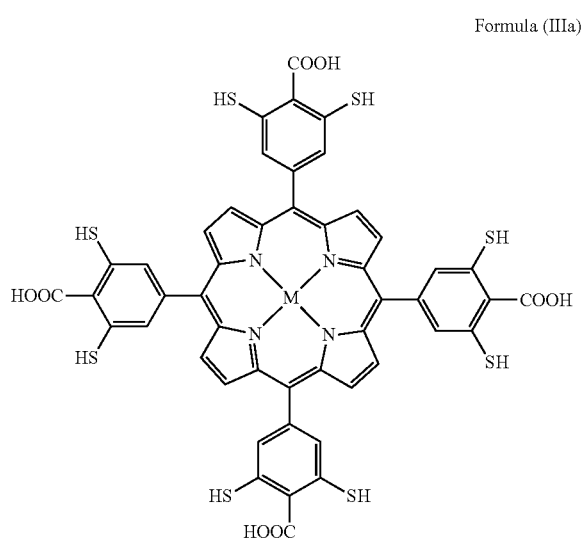

In a forth preferred embodiment, the MOF includes a compound having a structure of Formula (IV) or its derivative, Formula (IV)

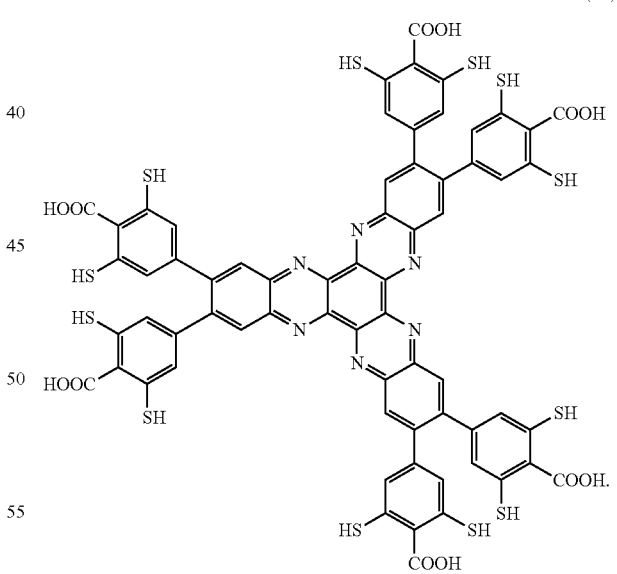

More preferably, when compared to embodiments having a structure of Formula (I) as discussed earlier, these embodiments with Formula II, III or IV have a large degree of conjugation and a planar, rigid molecular geometry, therefore may enhance the π-π stacking and improve the electron mobility.

Terms used herein may be preceded and/or followed by a single dash, "—", or a double dash, "═", to indicate the bond order of the bond between the named substituent and its parent moiety; a single dash indicates a single bond and a double dash indicates a double bond. In the absence of a single or double dash it is understood that a single bond is formed between the substituent and its parent moiety; further, substituents are intended to be read "left to right" unless a dash indicates otherwise. For example, C1-C6alkoxycarbonyloxy and OC(O)C1-C6alkyl indicate the same functionality; similarly arylalkyl and -alkylaryl indicate the same functionality.

The term "alkenyl" as used herein, means a straight or branched chain hydrocarbon containing from 2 to 10 carbons, unless otherwise specified, and containing at least one carbon-carbon double bond. Representative examples of alkenyl include, but are not limited to, ethenyl, 2-propenyl, 2-methyl-2-propenyl, 3-butenyl, 4-pentenyl, 5-hexenyl, 2-heptenyl, 2-methyl-1-heptenyl, 3-decenyl, and 3,7-dimethylocta-2,6-dienyl.

The term "alkyl" as used herein, means a straight or branched chain hydrocarbon containing from 1 to 10 carbon atoms, unless otherwise specified. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. When an "alkyl" group is a linking group between two other moieties, then it may also be a straight or branched chain; examples include, but are not limited to —CH2-, —CH2CH2-, —CH2CH2CHC(CH3)-, —CH2CH(CH2CH3)CH2-.

The term "alkynyl" as used herein, means a straight or branched chain hydrocarbon group containing from 2 to carbon atoms and containing at least one carbon-carbon triple bond. Representative examples of alkynyl include, but are not limited, to acetylenyl, 1-propynyl, 2-propynyl, 3-butynyl, 2-pentynyl, and 1-butynyl.

The term "aryl," as used herein, means a phenyl (i.e., monocyclic aryl), a bicyclic ring system containing at least one phenyl ring or an aromatic bicyclic ring containing only carbon atoms in the aromatic bicyclic ring system or a multicyclic aryl ring system, provided that the bicyclic or multicyclic aryl ring system does not contain a heteroaryl ring when fully aromatic. The bicyclic aryl can be azulenyl, naphthyl, or a phenyl fused to a monocyclic cycloalkyl, a monocyclic cycloalkenyl, or a monocyclic heterocyclyl. The bicyclic aryl is attached to the parent molecular moiety through any carbon atom contained within the phenyl portion of the bicyclic system, or any carbon atom with the napthyl or azulenyl ring. The fused monocyclic cycloalkyl or monocyclic heterocyclyl portions of the bicyclic aryl are optionally substituted with one or two oxo and/or thia groups.

In certain specific embodiments, the compounds of the present invention have the following structures:

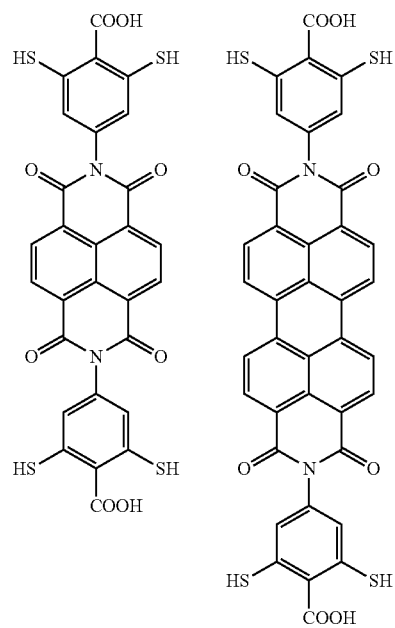

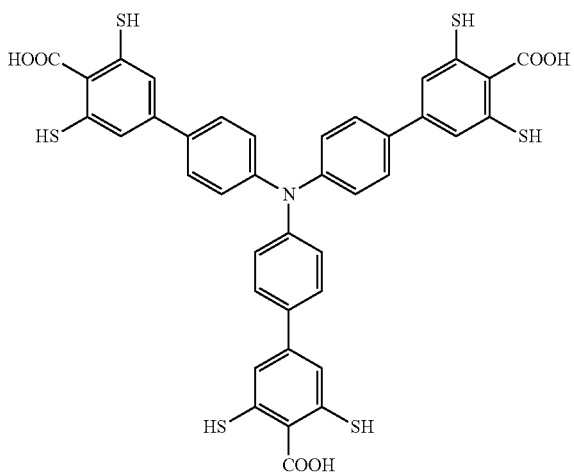

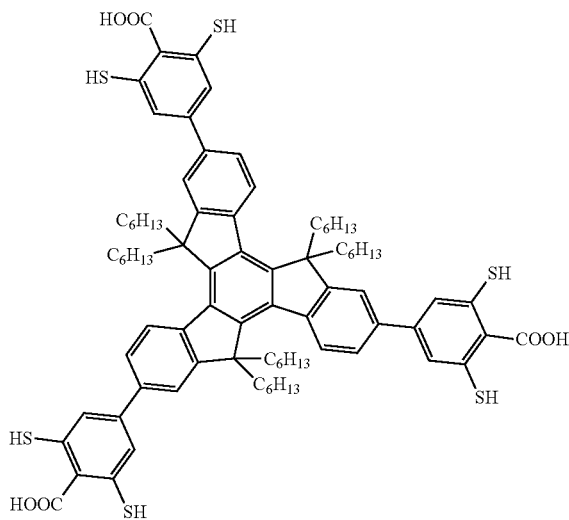

-continued

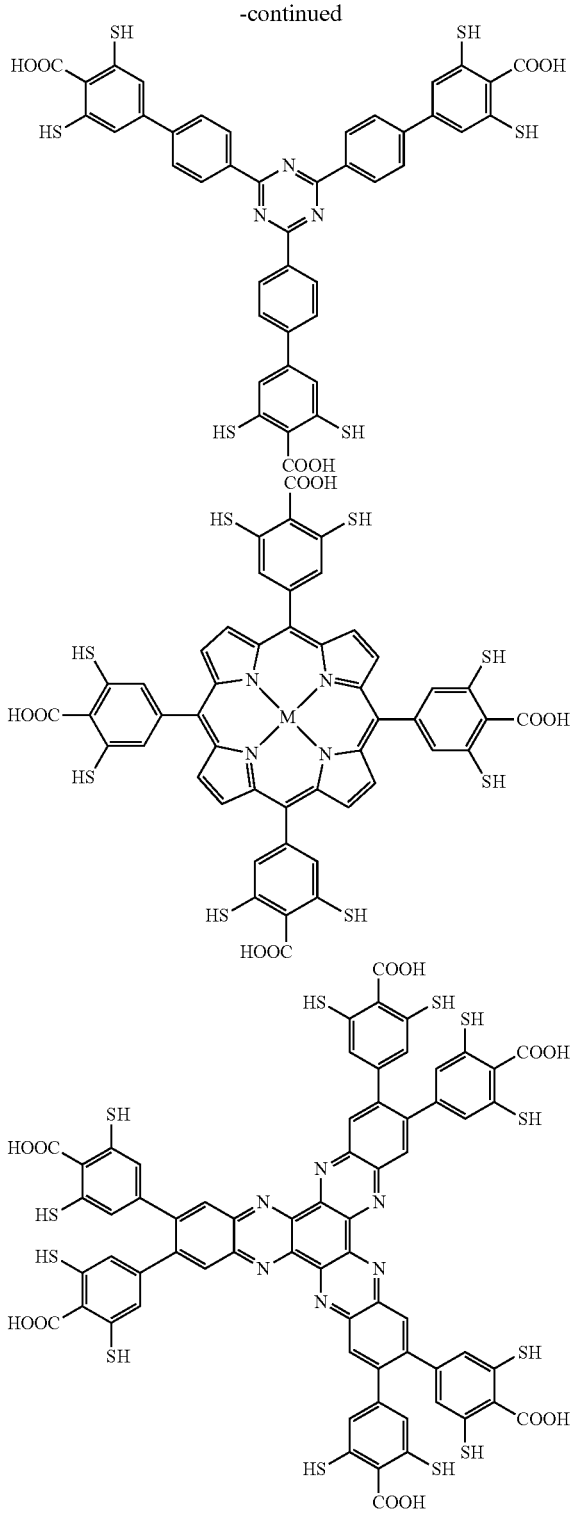

As described further herein, the compounds of the present application may be useful as electron transport materials in heterojunctions, optoelectronic devices, and other solid-state devices. These compounds are advantageously solution processable. Additionally, the energy levels of the compounds can be tuned through selection of particular substituents, thereby making them useful in conjunction with, for example, particular photoactive perovskite compounds. Furthermore, the compounds of the present application are less expensive to make than previously known electron transport materials, such as fullerenes.

Elemental and thermogravimetric analysis (TGA) results can be fitted with the formulas of $Zr_6O_4$ $(OH)_4$ $(L1)_3$ $(OH)_6$ $(H_2O)_{24}$ for ZrL1, $Zr_6O_4$ $(OH)_4$ $(L2)_2$ $(HCOO)_8$ $(H_2O)_{33}$ for ZrL2, and $Zr_6O_4$ $(OH)_4$ $(L3)_2$ $(OH)_6$ $(H_2O)_{27}$ (DMF) for ZrL3. The linker/$Zr_6$ cluster ratio thus determined points to full occupancy for the linker sites in ZrL1 and ZrL3, while about ⅓ of the six linker sites on each $Zr_6$ cluster of ZrL2 is missing (i.e., each Zr6 cluster is on average connected to four linkers). The linker deficiency here might be caused by the carboxyl endpoints of L2 being more dispersed (the ones in L1 and L3 are more densely spaced), consequently, the entropic effect more favouring L2 to be displaced by the capping groups. The capping sites can generally be occupied by the formate (HCOO⁻) and HO⁻/$H_2O$ species, but notice their ratios here cannot be pinpointed by the current data as their small weight fractions do not impact significantly the elemental and TGA results.

Figure 2:
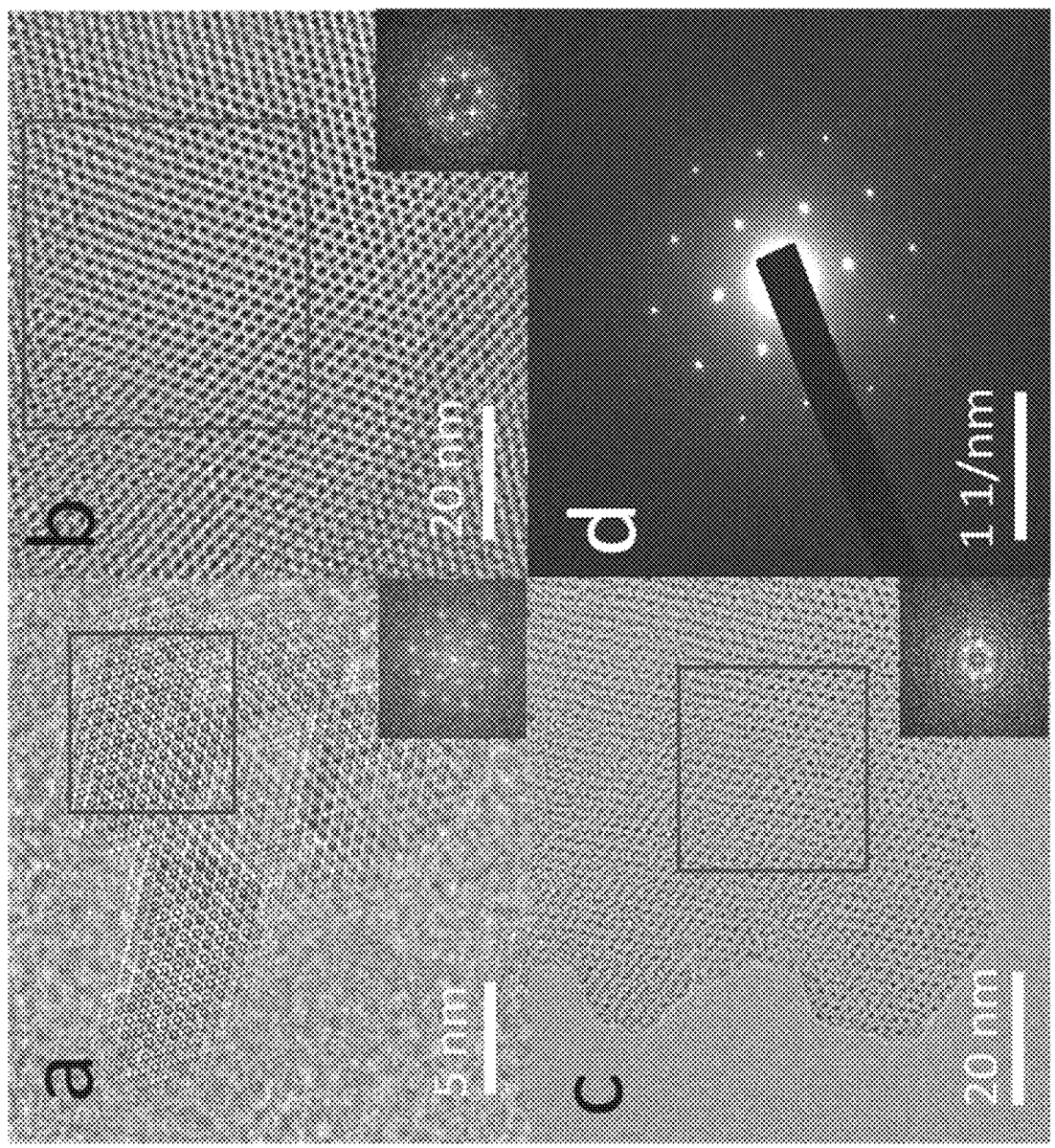
FIG. 2 provides TEM images of a) ZrL1, b) ZrL2, and c) ZrL3 showing the 2D structure present for all three MOFs, all insets are the FFT of the corresponding red area; and d) Electron diffraction of ZrL2 showing a good match between the diffraction pattern and the calculated FFT.
Figure 3:
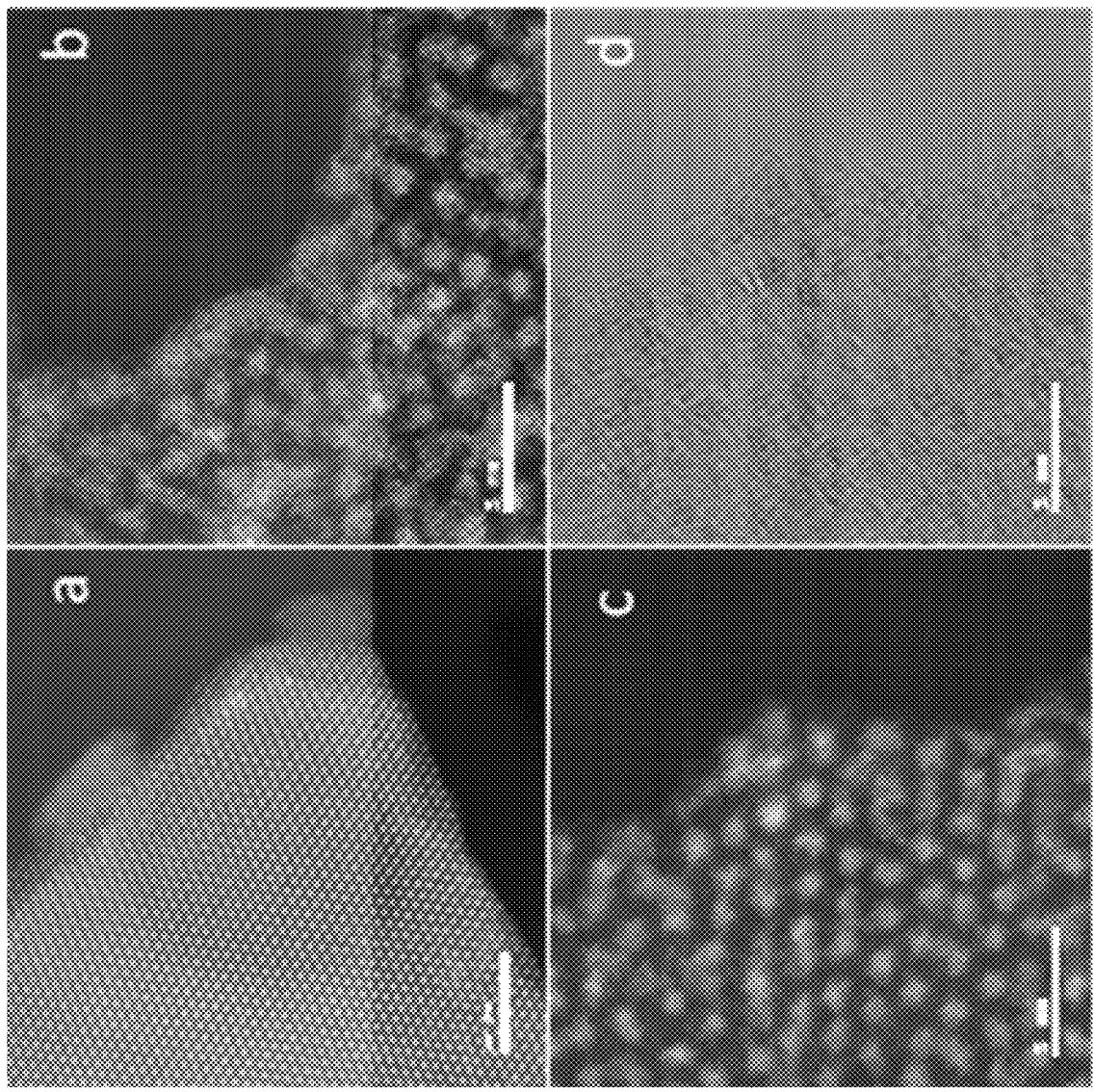
FIG. 3 provides TEM images showing high magnification images of (a) ZrL2 and (b-d) ZrL3 showing the eclipsed nature of the structure, the Zr—O clusters, and the surface termination.

With reference to FIG. 2, TEM may be used to characterize these 2D MOF structures. Low magnification overviews, FFT, and electron diffraction reveal the distinct hexagonal arrays of the 2D layers in ZrL1, ZrL2 and ZrL3. Moreover, with reference to FIG. 3, atomic resolution images from aberration corrected STEM indicate the direct (eclipsed) stacking of the MOF layers. Individual Zr atoms are seen within the Zr clusters. The surface clusters of a thin region were found to be more diffuse compared to the interior. In addition, the organic linkers between Zr clusters were revealed in the bright field images and the surface of ZrL3 was also shown to be terminated by the organic linkers.

Figure 4:
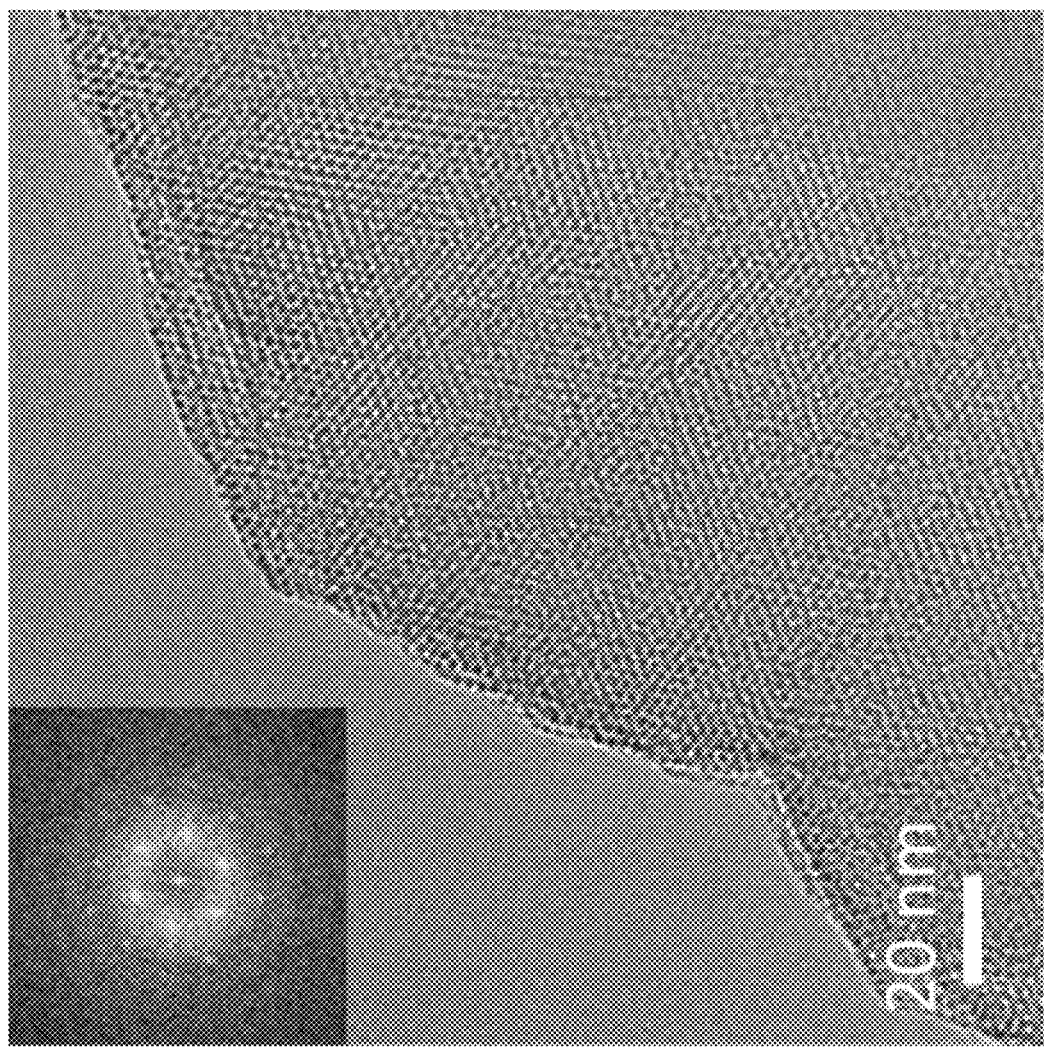
FIG. 4 is another TEM image showing ZrL2 at 500° C. showing the hexagonal 2D structure still present, the inset, FFT of the selected area.

TEM studies also point to remarkable stability of the 2D networks. With reference to FIG. 4, ZrL2 and ZrL3 were stable under prolonged parallel electron beam radiation (~30 $e^-Å^{-2}s^{-1}$) while imaging. Compared to other organic or biological samples that require cryogenic conditions to preserve the structure while imaging, ZrL2 and ZrL3 are much more robust. Heating of a ca. 35 nm thick region of ZrL2 structure also showed the lattice present even at 500° C., indicating the general structure stability at high temperature.

The stability of the MOF lattices is also verified by PXRD and gas sorption studies. The activated samples of ZrL1, ZrL2 and ZrL3 (e.g., obtained by soaking in hot acetonitrile) can be stored in air without degradation in crystallinity. The $N_2$ sorption isotherms (77 K) feature dominant type-I characteristics of microporous solids, with additional uptake at high $P/P_0$ regions that can be attributed to capillary condensation in mesopores (e.g., arising from the inter-particle/layer spaces).

Figure 5:
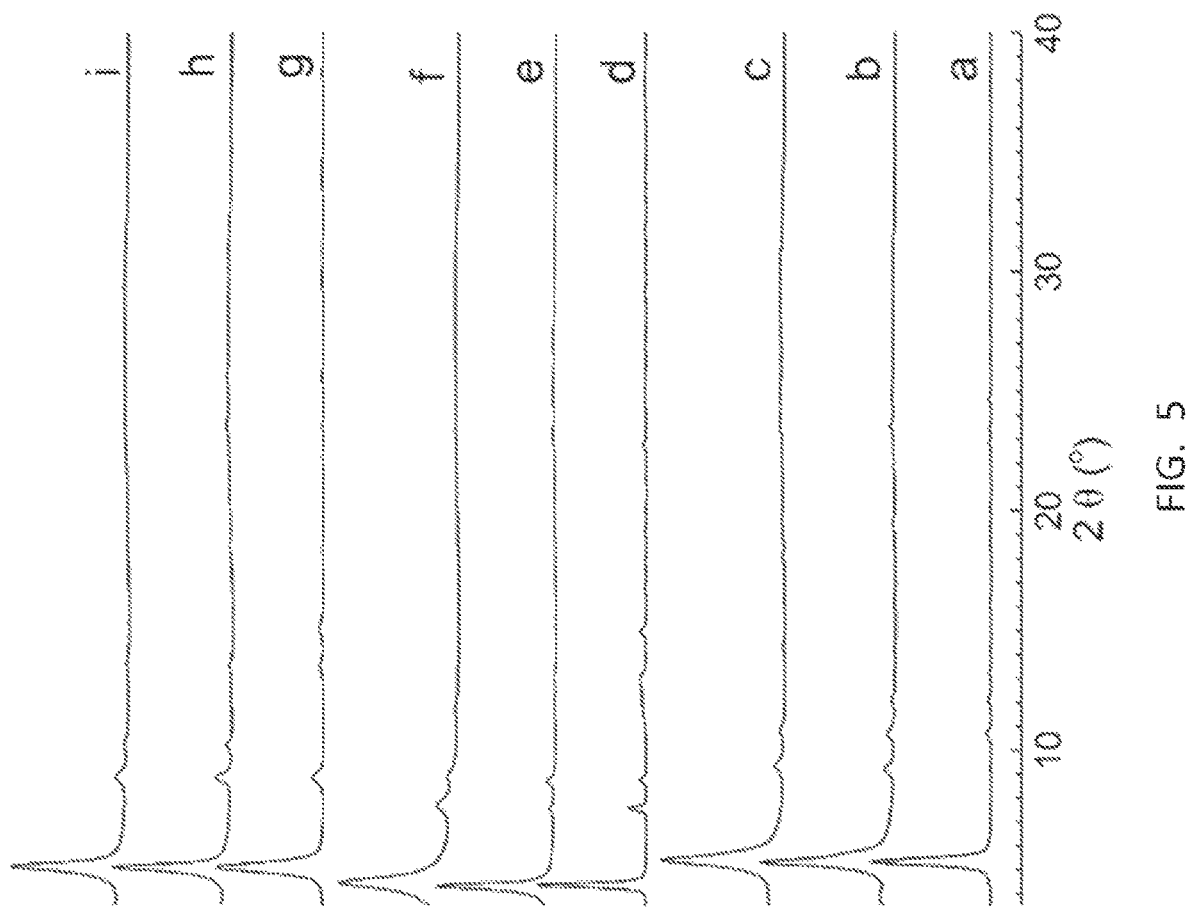
FIG. 5 provides plots showing Powder X-ray diffraction patterns (Cu K$\alpha$, $\lambda$=1.5418 Å): (a) calculated from the structure model of ZrL1 (with modification of crystalline size (500 nm×500 nm×50 nm) and preferred orientation (March-Dollase, 001, 1.2)); (b) a ZrL1-as made sample; (c) a ZrL1-boiling water sample; (d) calculated from the structure model (with modification of crystalline size (500 nm×500 nm×50 nm) and preferred orientation (March-Dollase, 100, 3)); (e) a ZrL2-as made sample; (f) a ZrL1-boiling water sample; (g) calculated from the structure model of ZrL1 (with modification of crystalline size (200 nm×200 nm×20 nm)); (h) a ZrL3-as made sample; and (i) ZrL3 treated with boiling water.

The BET surface areas are calculated to be 395 $m^2·g^{-1}$ for ZrL1, 722 $m^2·g^{-1}$ for ZrL2 (greater value consistent with its longer linker and linker deficiency), and 528 $m^2.g^{-1}$ for ZrL3. With reference to FIG. 5, to probe the hydrolytic stability, the MOF samples were placed in boiling water for 24 h, the PXRD patterns of all three samples remain strong indicating the retention of the crystalline phases.

Moreover, as per gas sorption studies, the boiling-water-treated samples continue to present substantial porosity, even though the surface areas were somewhat decreased (375 $m^2·g^{-1}$ for ZrL1, 383 $m^2·g^{-1}$ for ZrL2, and 369 $m^2·g^{-1}$ for ZrL3 after the boiling water treatment). In addition, with reference to FIGS. 6 to 8, IR measurements indicate that the peaks of S—H stretch (around 2555 $cm^{-1}$) disappeared after the boiling water treatment, pointing to the formation of S—S bonds from aerobic oxidation of the —SH groups. The S—S bonds as strong crosslinks likely play a key role in stabilizing the MOF structures.

Figure 6:
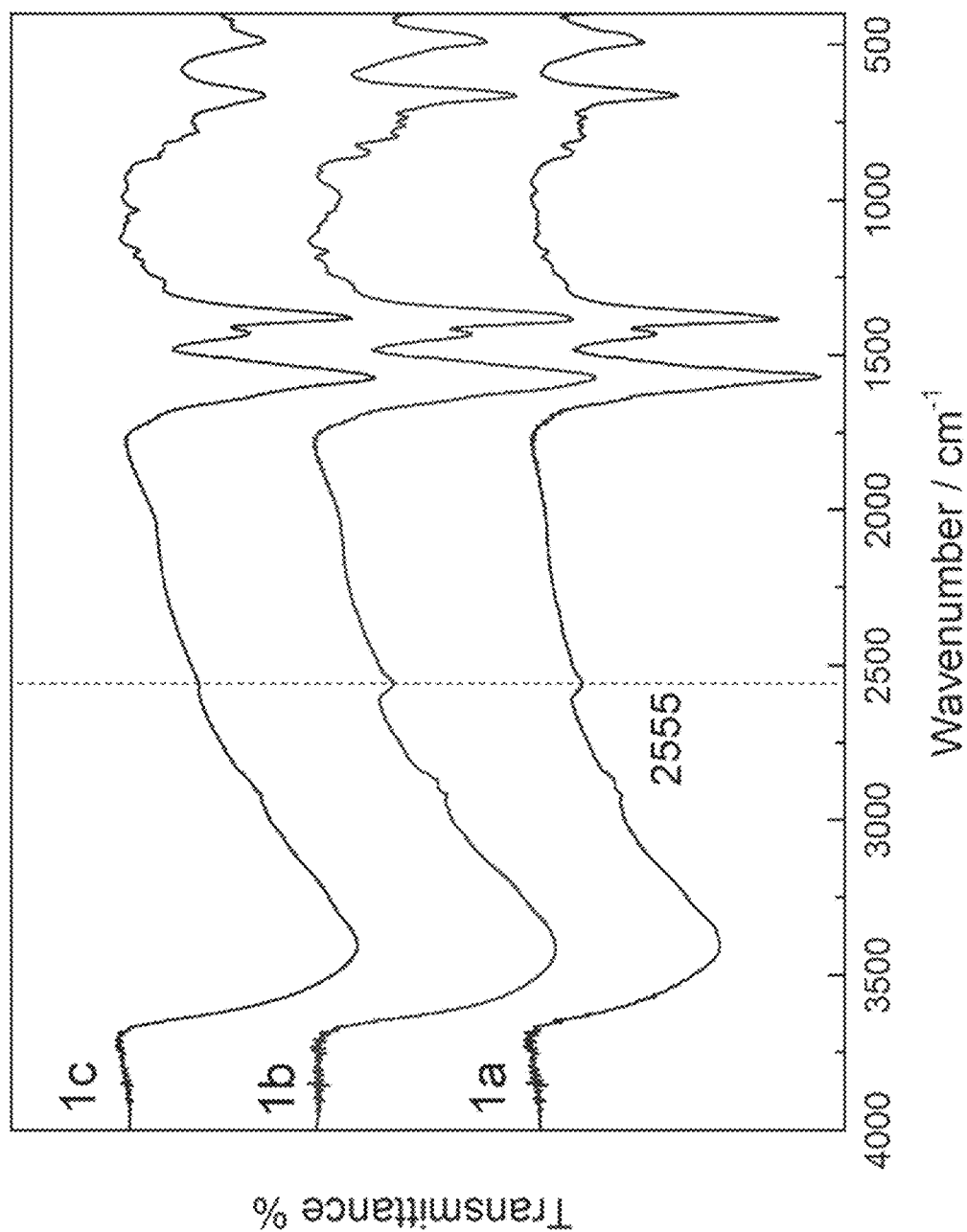
FIGS. 6, 7, and 8 are plots showing FT-IR spectra of a series of ZrL1, ZrL2 and ZrL3 samples respectively.

Referring to FIG. 6, there is shown FT-IR spectra of a series of ZrL1 samples. In the plot, 1a: an as-made ZrL1 sample (rinsed by acetone on a filter membrane, 0.22 μm); 1b: an activated ZrL1 sample (extensive solvent exchange with hot acetonitrile); and 1c: an as-made ZrL1 sample after boiling-water treatment.

The similar peak profiles of 1a and 1b, e.g., the lack of peaks around 1680 cm$^{-1}$ (corresponding to the C=O stretching of the DMF amide unit) indicates that both samples contained negligible amount of DMF and other guest molecules. To rigorously exclude the potential interference of the DMF guests, however, the PVSC devices were fabricated using the activated samples. The S—H stretching at 2555 cm$^{-1}$ disappeared in spectrum 1c and no sulfonate signal was observed between 1250-1000 cm$^{-1}$, implying the formation of S—S bonds during boiling-water treatment.

Figure 7:
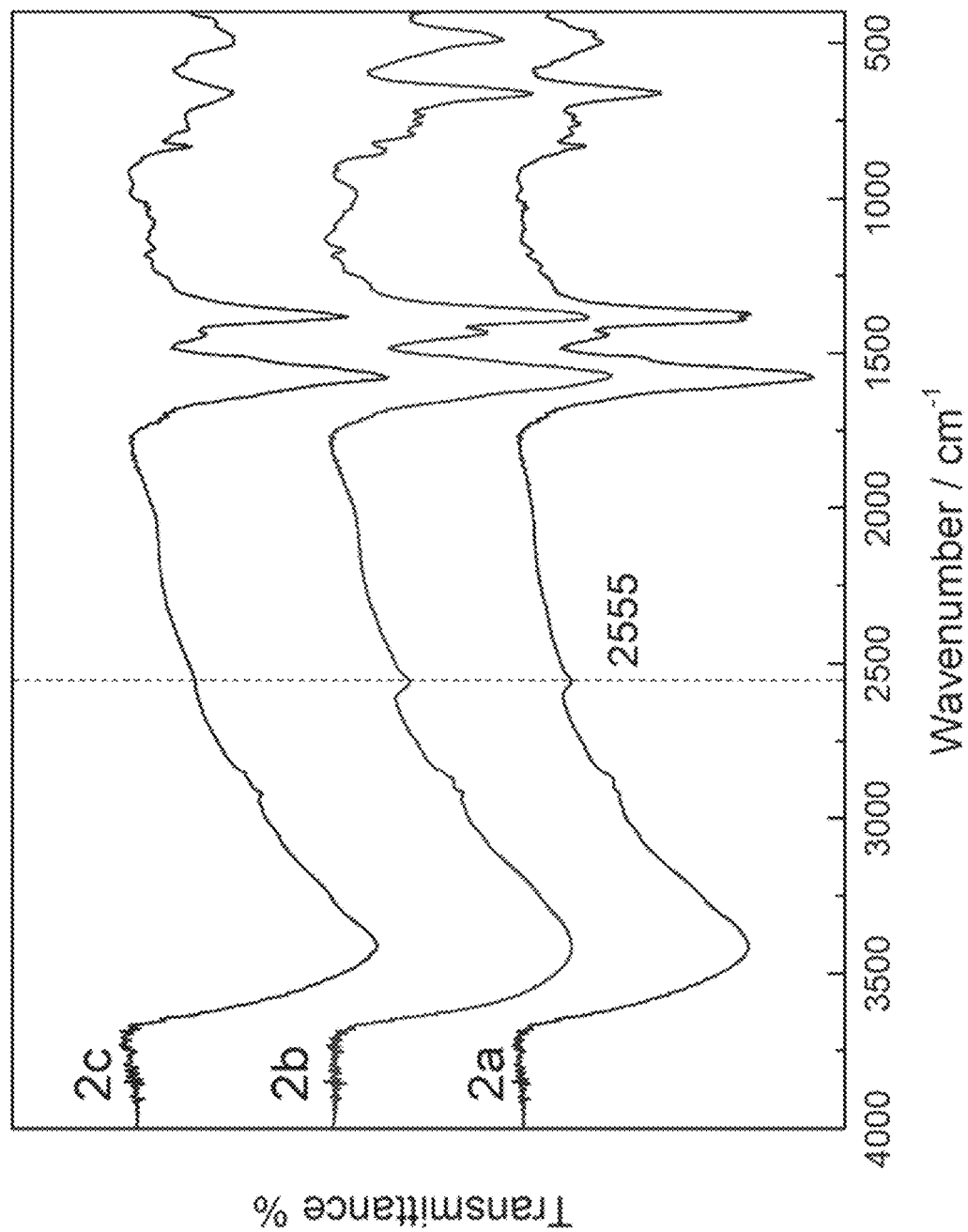

Referring to FIG. 7, there is shown FT-IR spectra of a series of ZrL2 samples. In this plot, 2a: an as-made ZrL2 sample (rinsed by acetone on a filter membrane, 0.22 μm); 2b: an activated ZrL2 sample (extensive solvent exchange with hot acetonitrile); and 2c: an as-made ZrL2 sample after boiling-water treatment.

The similar peak profiles of 2a and 2b, e.g., the lack of peaks around 1680 cm$^{-1}$ (corresponding to the C=O stretching of the DMF amide unit) indicates that both samples contained negligible amount of DMF and other guest molecules. To rigorously exclude the potential interference of the DMF guests, however, the PVSC devices were fabricated using the activated samples. The S—H stretching at 2555 cm$^{-1}$ disappeared in spectrum 2c and no sulfonate signal was observed between 1250-1000 cm$^{-1}$, implying the formation of S—S bonds during boiling-water treatment.

Figure 8:
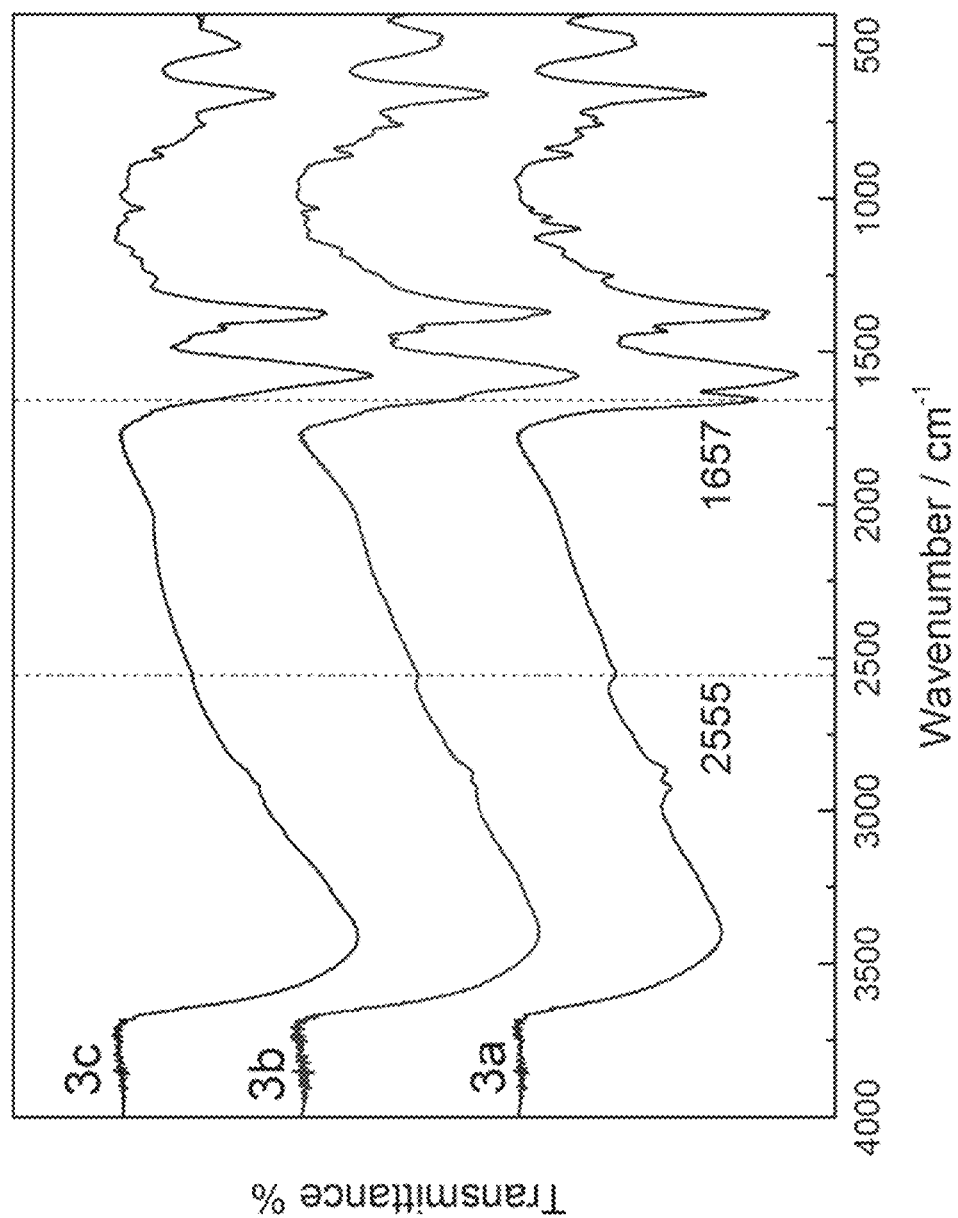

Referring to FIG. 8, there is shown FT-IR spectra of a series of ZrL3 samples. In this plot, 3a: an as-made ZrL3 sample (rinsed by acetone on a filter membrane, 0.22 μm); 3b: an activated ZrL3 sample (extensive solvent exchange with hot DMF and acetonitrile); and 3c: an activated ZrL3 sample after boiling-water treatment.

Unlike in the cases of as-made samples of ZrL1 and ZrL2, the acetone-rinsed, as-made ZrL3 contains significant amount of DMF (as evidenced by the strong peak at 1657 cm$^{-1}$ that corresponds to the amide C=O stretching). To avoid interference from the DMF guest, the activated ZrL3 sample was used for solar cell device fabrication. The S—H stretching at 2555 cm$^{-1}$ disappeared in spectrum 3c and no sulfonate signal was observed between 1250-1000 cm$^{-1}$, implying the formation of S—S bonds during boiling-water-treatment, following the same rule as ZrL1 and ZrL2.

With reference to FIG. 9A, the space-charge-limited-current (SCLC) method was used to investigate the electron-transporting properties of these prepared MOFs. The following table shows Electron mobility properties of ZrL1, ZrL2 and ZrL3.

| | Mobility [cm$^2$V$^{-1}$s$^{-1}$] |
|---|---|
| ZrL1 | 8.1*10$^{-5}$ |
| ZrL2 | 7.3*10$^{-5}$ |
| ZrL3 | 6.9*10$^{-5}$ |

The electron mobility of ZrL1 was measured to be 8.1×10$^{-5}$ cm$^2$V$^{-1}$s$^{-1}$, being slightly higher than those of ZrL2 (7.3×10$^{-5}$ cm$^2$V$^{-1}$s$^{-1}$) and ZrL3 (6.9×10$^{-5}$ cm$^2$V$^{-1}$s$^{-1}$) samples. It is worth to note that the relatively high electron mobilities of ZrL1, ZrL2 and ZrL3 are very encouraging considering the insulating nature of most of MOF solids. The high mobilities can be attributed to the dense thiol groups around the Zr6 cluster, which help rigidify framework (to minimize phonon scattering) and bridges the van der Waals gaps across the organic □-systems (by disulfide bonds).

To investigate the electron transfer ability between perovskite and these MOF ETLs, the steady-state photoluminescence (PL) spectra were also measured with bi-layered films of MOF ETL and mixed-cation perovskites. With reference to FIG. 9B, all samples have an emission peak at 770 nm from the mixed cation perovskite layer. An enhanced PL quenching can be clearly observed among three MOF based layered films compared to those from ITO/Perovskite and glass/Perovskite films. In principle, higher degree of PL quenching indicates better charge extraction from perovskite into ETL. Thus, these results suggest the MOF ETLs have very good electron extraction capability.

The time-resolved PL decay of the ETL/Perovskite films were measured to examine the electron transfer efficiency at the corresponding ETL/perovskite interface. Referring to FIGS. 9B and 9C, the plot also shows the corresponding time-resolved PL decay spectra of these films. A biexponential decay equation of $I(t)=I_0+A_1\exp(-t/\tau_1)+A_2\exp(-t/\tau_2)$ was used to fit the carrier lifetime. The fitting results as shown in the following table show two decay components $\tau_1$ and $\tau_2$, which the faster component $\tau_1$ was generated by the surface recombination and the slower component $\tau_2$ was from the charge recombination in bulk perovskite.

| Samples | $\tau_{ave}$ [ns] | $\tau_1$ [ns] | % of $\tau_1$ | $\tau_2$ [ns] | % of $\tau_2$ |
|---|---|---|---|---|---|
| Glass/PVK | 767.99 | 72.47 | 5.16 | 771.55 | 94.84 |
| ITO/PVK | 182.83 | 6.18 | 6.99 | 183.28 | 93.01 |
| ZrL1/PVK | 25.34 | 6.69 | 13.96 | 26.12 | 86.04 |
| ZrL2/PVK | 31.82 | 5.52 | 12.71 | 32.48 | 87.29 |
| ZrL3/PVK | 18.69 | 4.31 | 9.68 | 19.03 | 90.32 |

Preferably, the dominant and longer PL life time $\tau_2$ has the same trends with that of PL intensity, where ZrL1, ZrL2 and ZrL3 based bilayer perovskite had shorter lifetimes. Compared to the ITO/Perovskite and glass/Perovskite with a decay time ($\tau_2$) of 183.28 ns and 771.55 ns, the MOF based perovskite films showed significantly decreased PL decay time of 26.12 ns (ZrL1), 32.48 ns (ZrL2) and 19.03 ns (ZrL3), respectively. The shortened decay lifetime ($\tau_2$) of perovskite with MOFs basically suggests better electron extraction and dissociation efficiency from perovskite to MOF.

Figure 10B:
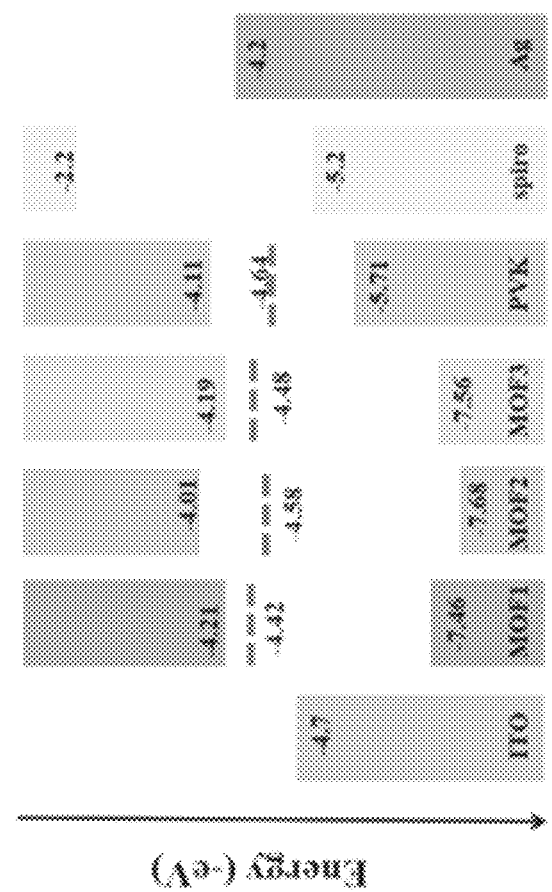
FIGS. 10A and 10B are illustrations showing an example optoelectronic device, and according the energy band diagram of the MOF based PVSC, in accordance of an embodiment of the present invention.
Figure 10A:
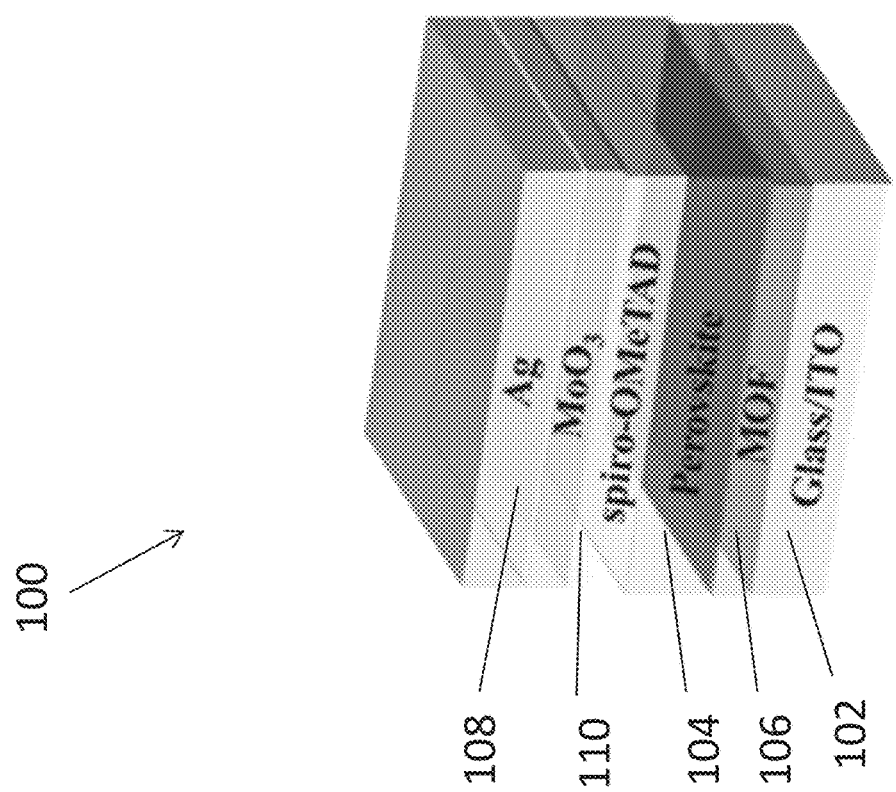

With reference to FIG. 10A, there is shown an embodiment of a photovoltaic cell 100 including the MOF materials according to the abovementioned embodiments. In this example, the photovoltaic cell comprises: a first electrode 102; a photoactive perovskite layer 104; an electron transport layer 106 comprising a compound according to the present invention disposed on a surface of the photoactive perovskite layer 104 opposite the first electrode 102; and a second electrode disposed 108 on a surface of the electron transport layer 106 opposite the photoactive perovskite layer 104.

Preferably, the optoelectronic device further comprises a charge transport layer intermediate the first electrode and the photoactive perovskite layer. Such a charge transport layer could be a hole transport material 110 including Spiro-MeOTAD and/or $MoO_3$.

Preferably, the photoactive perovskite layer comprises the photoactive perovskite materials as described further herein.

The thickness of the photoactive perovskite layer (also referred to as a film) may be chosen to optimize the device performance. Where the photoactive perovskite layer is a light-absorbing perovskite layer, if the film is too thin, then that region will not absorb sufficient sunlight. If the film is too thick, there is a significant chance that the electron and hole (or exciton) diffusion length will be shorter than the film thickness and that the charge will therefore not be collected efficiently.

As discussed above, the photoactive perovskite includes ammonium trihalogen plumbate, such as but not limited to methyl, formamidinium, and cesium ammonium plumbate.

For optimal performance it is particularly preferred that the perovskite layer is of substantially uniform thickness. In one embodiment, that thickness in a heterojunction may be less than the charge transfer distance of the perovskite selected for forming that heterojunction.

For example, in planar (i.e. compact) perovskite layers, the thickness of the photoactive perovskite layer may be preferably in the range 50 to 500 nm, e.g. 100 to 450 nm, 100 to 400 nm or 100 to 350 nm. A thickness of 200 to 350 nm, e.g. 300 nm, is particularly preferred. In one preferred embodiment, the compact perovskite layer does not exceed 330 nm in thickness.

Optionally, any of the heterojunctions or optoelectronic devices (e.g. solar cells) of the present invention may be encapsulated. Such encapsulation will be such that the heterojunctions or devices are maintained in the substantial absence of oxygen (particularly molecular oxygen such as atmospheric oxygen). Substantial absence may indicate that the concentration of molecular oxygen within the encapsulation is less than 10%, preferably less than 1% of the concentration in the surrounding atmosphere.

In addition, heterojunctions such as those described therein may be fabricated on a glass substrate which serves both to assist in encapsulation and to allow transmission of light to/from the heterojunction. FTO (fluorine-tin-oxide) coated glass substrates are particularly preferred as the FTO coating may function as an anode. For example, referring to FIG. 10A, an ITO/glass substrate may be used for fabricating the photovoltaic cell.

Optoelectronic devices comprising at least one heterojunction as herein described also self-evidently form part of the present invention. Thus in one embodiment the invention provides an optoelectronic device comprising at least one solid-state heterojunction as herein described. In particular, such an optoelectronic device may be a solar cell or photodetector. In a further embodiment, the optoelectronic device of the invention may be a light-emitting diode (LED).

Similarly, the optoelectronic device of the invention may also be encapsulated. In one embodiment, the optoelectronic device of the invention may comprise a solid-state heterojunction as herein described as the top cell in a tandem junction. In a further embodiment, the optoelectronic device of the invention may comprise a solid-state heterojunction as herein described as the top cell in a multiple junction and a further solid-state heterojunction as herein described as the bottom cell in said multiple junction.

In this example, the optoelectronic device may be used to examine the photovoltaic properties of perovskite solar cells (PVSCs) with ZrL1, ZrL2 and ZrL3 as electron transporting layer (ETLs). The optoelectronic device may be a fabricated planar n-i-p device (ITO/MOF/perovskite/spiro-OMeTAD/$MoO_3$/Ag).

The device may be fabricated using the following process.

Preparation of perovskite precursor solution: $Cs_{0.08}(FA_{0.83}MA_{0.17})_{0.92}Pb(I_{0.83}Br_{0.17})_3$ perovskite solution may be prepared by dissolving FAI (1 M), $PbI_2$ (1.1 M), MABr (0.2 M), $PbBr_2$ (0.22 M) in a mixed solvent of N,N-dimethylformamide (DMF) and dimethylsulfoxide (DMSO) with a volume ratio of 5:1. The MOF precursor solutions may be prepared by adding ZrL1, ZrL2 and ZrL3 into the isopropanol with the concentration of 2 mg/mL. The spiro-OMeTAD solution may be prepared by dissolving 72.3 mg spiro-OMeTAD in 1 mL of chlorobenzene with 28 μL 4-tert-butylpyridine, 17.5 μL Li-bis(trifluoromethanesulfonyl)imide (Li-TFSI, 520 mg/mL in acetonitrile), and 29 μL tris(2-(1H-pyrazol-1-yl)-4-tertbutylpyridine)cobalt(iii)tris (bis (trifluoromethyllsulfonyl)imide) (FK 209, 300 mg/mL in acetonitrile).

Device fabrication: Indium tin oxide (ITO)-coated glass (15Ω $sq^{-1}$) may be cleaned by sequentially sonication with detergent (Decon 90), deionized water, acetone, and isopropyl alcohol for 10 min, respectively. The MOF layer may be prepared by spin-coating MOF precursor solutions onto the ITO substrates at 3000 rpm for 40 s and annealed at 100° C. for 5 min. Afterward, the perovskite precursor solution may be spin-coated at 1000 rpm for 5 s and then 6000 rpm for 30 s. During the last 5 s of the second spin-coating step, 0.1 mL chlorobenzene may be dropped onto the substrate. Subsequently, the Spiro-OMeTAD layer may be spin-coated on top of the perovskite layer at 4,000 rpm. for 30 s. Finally, 6 nm of $MoO_3$ and 80 nm silver electrode may be evaporated under high vacuum (<1×$10^{-6}$ Torr). The device area was defined as 0.13 $cm^2$ through metal shadow mask.

With reference to FIG. 10B, there is shown an energy diagram of the PVSCs using MOF as the ETL, which the conduction band minimum (CBM) level of ZrL1 (-4.21 eV), ZrL2 (-4.01 eV) and ZrL3 (-4.19 eV) is well matched with the CBM (-4.11 eV) of mixed cation perovskite, which will facilitate efficient electron injection from perovskite to ETL.

Figure 10D:
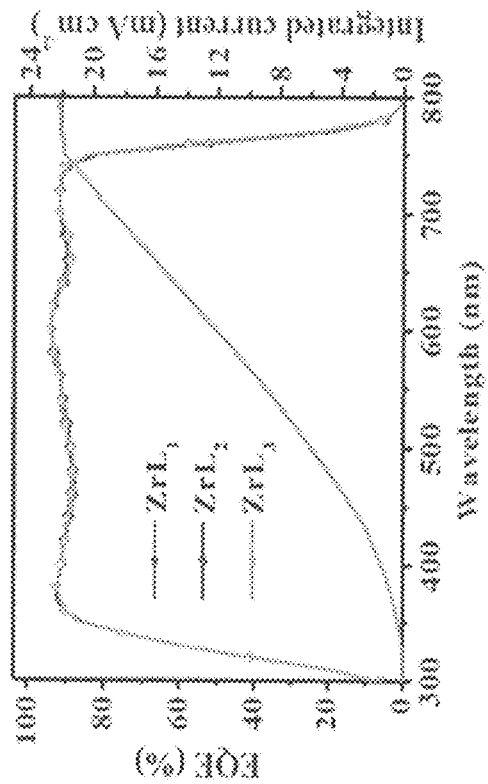
FIGS. 10C and 10D are plots showing J-V curves and EQE spectrums of tested performing PVSCs of FIG. 10A prepared with ETMs; and Histogram of efficiency distributions of PVSCs prepared with ETMs.
Figure 10F:
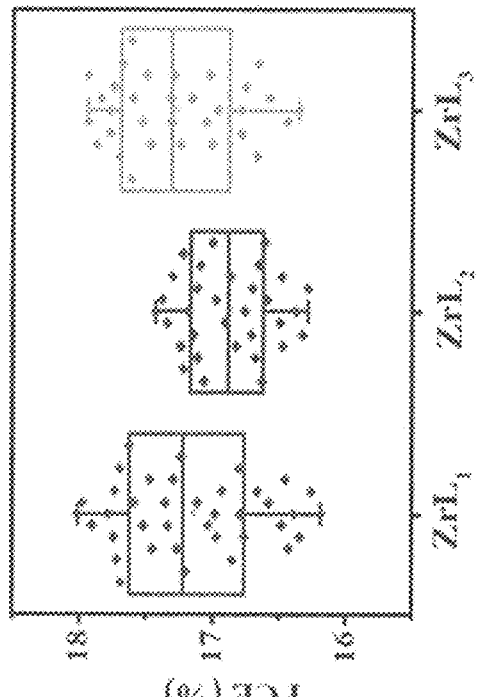
FIG. 10F provides PCE distributions revealing good reproducibility for the fabricated PVSCs using the MOF ETL.
Figure 10C:
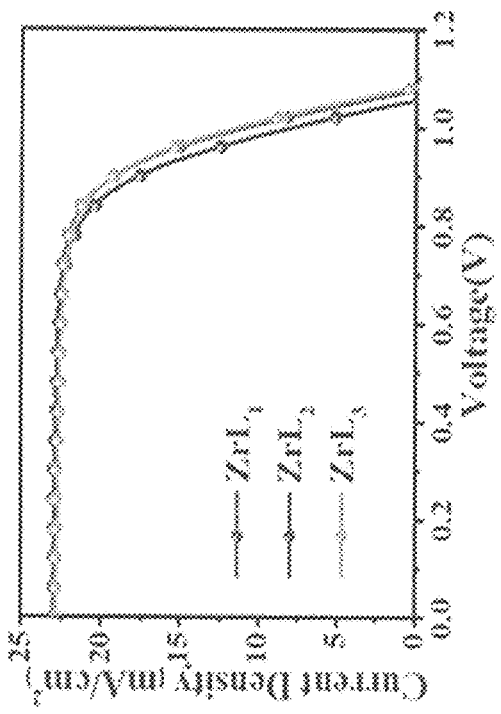

With reference to FIG. 10C, there is shown the current density-voltage (J-V) characteristics under the AM 1.5 G irradiation at 100 mW $cm^{-2}$ for the studied PVSCs using MOF ETLs. The relevant photovoltaic parameters of open circuit voltage ($V_{oc}$), short circuit current ($J_{sc}$), fill factor (FF) and PCE of these devices were summarized in the following Table.

| | $V_{OC}$ [V] | $J_{SC}$ [mA $cm^{-2}$] | FF [%] | PCE [%] |
|---|---|---|---|---|
| $ZrL_1$ | 1.08 | 23.0 | 72.3 | 18.0 |
| $ZrL_2$ | 1.06 | 22.9 | 71.7 | 17.4 |
| $ZrL_3$ | 1.08 | 23.0 | 71.9 | 17.9 |

The fabricated PVSCs achieved impressive PCE of 18.0%, 17.4% and 17.9%, respectively. The champion ZrL1 based PVSC shows a high PCE of 18.0% with a $V_{oc}$ of 1.08 V, a $J_{sc}$ of 23.0 mA $cm^{-2}$, and a FF of 72.3%. Referring to the external quantum efficiency (EQE) spectra of FIG. 10D, the fabricated devices showed that the integrated photocurrent values were consistent with the $J_{sc}$ from the J-V experimental measurements.

Figure 10E:
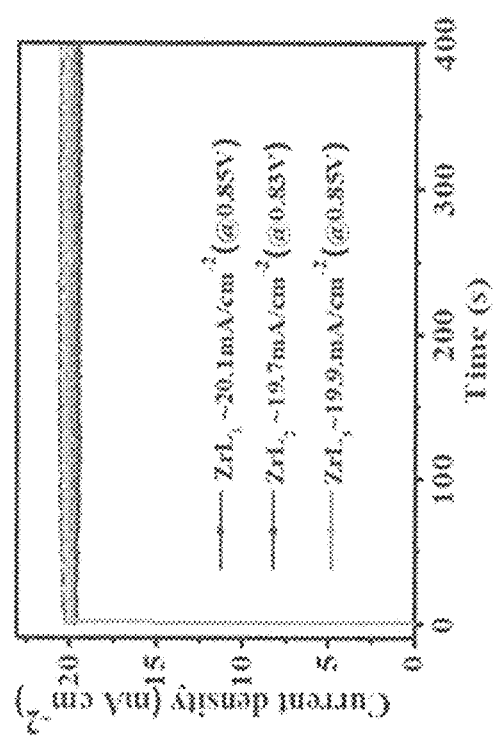
FIG. 10E provides a plot showing the stabilized PCE and photocurrent at the maximum power point.

With reference to FIG. 10E, the plot showed the stabilized PCE and photocurrent at the maximum power point. As can be seen, the PCE and photocurrent remained stable after 400 s scan, which clearly confirmed the good reliability of the above device results.

The PCE distributions in FIG. 10F revealed good reproducibility for the fabricated PVSCs using the MOF ETL, which delivered an average PCE of ~17.1% (ZrL1), ~16.9% (ZrL2) and ~17.2% ns (ZrL3).

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A heterojunction comprising:
a photoactive layer comprising a photoactive perovskite; and an electron transport layer including a compound having a structure of Formula (Ic):

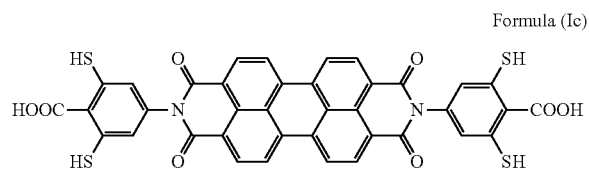 [SMILES: O=C(O)c1c(S)cc(N2C(=O)c3ccc4c5ccc6c7c(ccc(c8ccc(c3c48)C2=O)c75)C(=O)N(c2cc(S)c(C(=O)O)c(S)c2)C6=O)cc1S]

Formula (Ic)

wherein the electron transport layer includes a metal-organic framework.

2. The heterojunction of claim 1, wherein the metal-organic framework includes a Zr metal-organic framework.

3. The heterojunction of claim 1, wherein the photoactive perovskite includes an ammonium trihalogen plumbate.

4. The heterojunction of claim 3, wherein the ammonium trihalogen plumbate is selected from the group consisting of methyl, formamidinium, and cesium ammonium plumbate.

5. An optoelectronic device comprising a pair of electrodes disposed on opposite sides of the heterojunction in accordance with claim 1.

6. The optoelectronic device of claim 5, further comprising a charge transport layer adjacent to the photoactive perovskite layer.

7. The optoelectronic device of claim 6, wherein the charge transport layer includes a hole transport material.

8. The optoelectronic device of claim 7, wherein the hole transport material includes Spiro-MeOTAD and/or $MoO_3$.

9. The optoelectronic device of claim 5, wherein the metal-organic framework includes a Zr metal-organic framework.

10. The optoelectronic device of claim 5, wherein the photoactive perovskite includes an ammonium trihalogen plumbate.

11. The optoelectronic device of claim 10, wherein the ammonium trihalogen plumbate is selected from the group consisting of methyl, formamidinium, and cesium ammonium plumbate.

12. The optoelectronic device of claim 5, wherein the optoelectronic device is a photovoltaic cell.

* * * * *